(12) United States Patent
Neudecker et al.

(10) Patent No.: US 9,334,557 B2
(45) Date of Patent: May 10, 2016

(54) METHOD FOR SPUTTER TARGETS FOR ELECTROLYTE FILMS

(75) Inventors: Bernd J. Neudecker, Littleton, CO (US); Jay F. Whitacre, Pittsburgh, PA (US)

(73) Assignee: SAPURAST RESEARCH LLC, Wilmington, DE (US)

( * ) Notice: Subject to any disclaimer, the term of this patent is extended or adjusted under 35 U.S.C. 154(b) by 1913 days.

(21) Appl. No.: 12/339,361

(22) Filed: Dec. 19, 2008

(65) Prior Publication Data

US 2009/0159433 A1    Jun. 25, 2009

Related U.S. Application Data

(60) Provisional application No. 61/016,038, filed on Dec. 21, 2007.

(51) Int. Cl.
| | |
|---|---|
| *C23C 14/38* | (2006.01) |
| *C23C 14/06* | (2006.01) |
| *C23C 14/00* | (2006.01) |
| *C23C 14/22* | (2006.01) |
| *C23C 14/34* | (2006.01) |

(Continued)

(52) U.S. Cl.
CPC .............. *C23C 14/06* (2013.01); *C23C 14/0036* (2013.01); *C23C 14/22* (2013.01); *C23C 14/3407* (2013.01); *C23C 14/3414* (2013.01); *C23C 14/352* (2013.01); *H01M 2/145* (2013.01); *H01M 6/188* (2013.01); *H01M 6/40* (2013.01); *H01M 10/0525* (2013.01); *H01M 10/0562* (2013.01); *H01M 10/058* (2013.01); *Y02E 60/122* (2013.01); *Y02P 70/54* (2015.11)

(58) Field of Classification Search
CPC .... C23C 14/06; C23C 14/0036; C23C 14/38; H01M 2/145
USPC ...................... 204/192.15; 429/322, 127, 162
See application file for complete search history.

(56) References Cited

U.S. PATENT DOCUMENTS

| | | |
|---|---|---|
| 712,316 A | 10/1902 | Loppe et al. |
| 2,970,180 A | 1/1961 | Urry |

(Continued)

FOREIGN PATENT DOCUMENTS

| | | |
|---|---|---|
| CN | 1415124 | 4/2003 |
| CN | 1532984 | 9/2004 |

(Continued)

OTHER PUBLICATIONS

Ionized sputter deposition using an extremely high plasma density pulsed magnetron discharge Karol Macak, Vladimir Kouznetsov, Jochen Schneider, and Ulf Helmersson Journal of Vacuum Science Technology Jul./Aug. 2000.*

(Continued)

*Primary Examiner* — Jason M Berman
(74) *Attorney, Agent, or Firm* — Blakely, Sokoloff, Taylor & Zafman LLP

(57) ABSTRACT

Alternative sputter target compositions or configurations for thin-film electrolytes are proposed whereby the sputter target materials system possesses sufficient electrical conductivity to allow the use of (pulsed) DC target power for sputter deposition. The electrolyte film materials adopt their required electrically insulating and lithium-ion conductive properties after reactive sputter deposition from the electrically conducting sputter target materials system.

25 Claims, 7 Drawing Sheets

(51) Int. Cl.
*C23C 14/35* (2006.01)
*H01M 2/14* (2006.01)
*H01M 6/18* (2006.01)
*H01M 6/40* (2006.01)
*H01M 10/0525* (2010.01)
*H01M 10/0562* (2010.01)
*H01M 10/058* (2010.01)

(56) References Cited

U.S. PATENT DOCUMENTS

| | | | |
|---|---|---|---|
| 3,309,302 A | 3/1967 | Heil | |
| 3,616,403 A | 10/1971 | Collins et al. | |
| 3,790,432 A | 2/1974 | Fletcher et al. | |
| 3,797,091 A | 3/1974 | Gavin | |
| 3,850,604 A | 11/1974 | Klein | |
| 3,939,008 A | 2/1976 | Longo et al. | |
| 4,082,569 A | 4/1978 | Evans, Jr. | |
| 4,111,523 A | 9/1978 | Kaminow et al. | |
| 4,127,424 A | 11/1978 | Ullery, Jr. | |
| 4,226,924 A | 10/1980 | Kimura et al. | |
| 4,283,216 A | 8/1981 | Brereton | |
| 4,318,938 A | 3/1982 | Barnett et al. | |
| 4,328,297 A | 5/1982 | Bilhorn | |
| 4,395,713 A | 7/1983 | Nelson et al. | |
| 4,437,966 A | 3/1984 | Hope et al. | |
| 4,442,144 A | 4/1984 | Pipkin | |
| 4,467,236 A | 8/1984 | Kolm et al. | |
| 4,481,265 A | 11/1984 | Ezawa et al. | |
| 4,518,661 A | 5/1985 | Rippere | |
| 4,555,456 A | 11/1985 | Kanehori et al. | |
| 4,572,873 A | 2/1986 | Kanehori et al. | |
| 4,587,225 A | 5/1986 | Tsukuma et al. | |
| 4,619,680 A | 10/1986 | Nourshargh et al. | |
| 4,645,726 A | 2/1987 | Hiratani et al. | |
| 4,664,993 A | 5/1987 | Sturgis et al. | |
| 4,668,593 A | 5/1987 | Sammells | |
| RE32,449 E | 6/1987 | Claussen | |
| 4,672,586 A | 6/1987 | Shimohigashi et al. | |
| 4,710,940 A | 12/1987 | Sipes, Jr. | |
| 4,728,588 A | 3/1988 | Noding et al. | |
| 4,740,431 A | 4/1988 | Little | |
| 4,756,717 A | 7/1988 | Sturgis et al. | |
| 4,785,459 A | 11/1988 | Baer | |
| 4,826,743 A | 5/1989 | Nazri | |
| 4,865,428 A | 9/1989 | Corrigan | |
| 4,878,094 A | 10/1989 | Balkanski | |
| 4,903,326 A | 2/1990 | Zakman et al. | |
| 4,915,810 A | 4/1990 | Kestigian et al. | |
| 4,964,877 A | 10/1990 | Keister et al. | |
| 4,977,007 A | 12/1990 | Kondo et al. | |
| 4,978,437 A | 12/1990 | Wirz | |
| 5,006,737 A | 4/1991 | Fay | |
| 5,019,467 A | 5/1991 | Fujiwara | |
| 5,030,331 A | 7/1991 | Sato | |
| 5,035,965 A | 7/1991 | Sangyoji et al. | |
| 5,055,704 A | 10/1991 | Link et al. | |
| 5,057,385 A | 10/1991 | Hope et al. | |
| 5,085,904 A | 2/1992 | Deak et al. | |
| 5,096,852 A | 3/1992 | Hobson | |
| 5,100,821 A | 3/1992 | Fay | |
| 5,107,538 A | 4/1992 | Benton et al. | |
| 5,110,694 A | 5/1992 | Nagasubramanian et al. | |
| 5,110,696 A | 5/1992 | Shokoohi et al. | |
| 5,119,269 A | 6/1992 | Nakayama | |
| 5,119,460 A | 6/1992 | Bruce et al. | |
| 5,124,782 A | 6/1992 | Hundt et al. | |
| 5,147,985 A | 9/1992 | DuBrucq | |
| 5,153,710 A | 10/1992 | McCain | |
| 5,169,408 A | 12/1992 | Biggerstaff et al. | |
| 5,171,413 A | 12/1992 | Arntz et al. | |
| 5,173,271 A | 12/1992 | Chen et al. | |
| 5,174,876 A | 12/1992 | Buchal et al. | |
| 5,180,645 A | 1/1993 | Moré | |
| 5,187,564 A | 2/1993 | McCain | |
| 5,196,041 A | 3/1993 | Tumminelli et al. | |
| 5,196,374 A | 3/1993 | Hundt et al. | |
| 5,200,029 A | 4/1993 | Bruce et al. | |
| 5,202,201 A | 4/1993 | Meunier et al. | |
| 5,206,925 A | 4/1993 | Nakazawa et al. | |
| 5,208,121 A | 5/1993 | Yahnke et al. | |
| 5,217,828 A | 6/1993 | Sangyoji et al. | |
| 5,221,891 A | 6/1993 | Janda et al. | |
| 5,225,288 A | 7/1993 | Beeson et al. | |
| 5,227,264 A | 7/1993 | Duval et al. | |
| 5,237,439 A | 8/1993 | Misono et al. | |
| 5,252,194 A | 10/1993 | Demaray et al. | |
| 5,262,254 A | 11/1993 | Koksbang et al. | |
| 5,273,608 A | 12/1993 | Nath | |
| 5,287,427 A | 2/1994 | Atkins et al. | |
| 5,296,089 A | 3/1994 | Chen et al. | |
| 5,300,461 A | 4/1994 | Ting | |
| 5,302,474 A | 4/1994 | Shackle et al. | |
| 5,303,319 A | 4/1994 | Ford et al. | |
| 5,306,569 A | 4/1994 | Hiraki | |
| 5,307,240 A | 4/1994 | McMahon | |
| 5,309,302 A | 5/1994 | Vollmann | |
| 5,314,765 A * | 5/1994 | Bates | 429/231.95 |
| 5,326,652 A | 7/1994 | Lake | |
| 5,326,653 A | 7/1994 | Chang | |
| 5,338,624 A | 8/1994 | Gruenstern et al. | |
| 5,338,625 A | 8/1994 | Bates et al. | |
| 5,342,709 A | 8/1994 | Yahnke et al. | |
| 5,355,089 A | 10/1994 | Treger et al. | |
| 5,360,686 A | 11/1994 | Peled et al. | |
| 5,362,579 A | 11/1994 | Rossoll et al. | |
| 5,381,262 A | 1/1995 | Arima et al. | |
| 5,387,482 A | 2/1995 | Anani | |
| 5,401,595 A | 3/1995 | Kagawa et al. | |
| 5,403,680 A | 4/1995 | Otagawa et al. | |
| 5,411,537 A | 5/1995 | Munshi et al. | |
| 5,411,592 A | 5/1995 | Ovshinsky et al. | |
| 5,419,982 A | 5/1995 | Tura et al. | |
| 5,427,669 A | 6/1995 | Drummond | |
| 5,435,826 A | 7/1995 | Sakakibara et al. | |
| 5,437,692 A | 8/1995 | Dasgupta et al. | |
| 5,445,856 A | 8/1995 | Chaloner-Gill | |
| 5,445,906 A | 8/1995 | Hobson et al. | |
| 5,448,110 A | 9/1995 | Tuttle et al. | |
| 5,449,576 A | 9/1995 | Anani | |
| 5,455,126 A | 10/1995 | Bates et al. | |
| 5,457,569 A | 10/1995 | Liou et al. | |
| 5,458,995 A | 10/1995 | Behl et al. | |
| 5,464,692 A | 11/1995 | Huber | |
| 5,464,706 A | 11/1995 | Dasgupta et al. | |
| 5,470,396 A | 11/1995 | Mongon et al. | |
| 5,472,795 A | 12/1995 | Atita | |
| 5,475,528 A | 12/1995 | LaBorde | |
| 5,478,456 A | 12/1995 | Humpal et al. | |
| 5,483,613 A | 1/1996 | Bruce et al. | |
| 5,493,177 A | 2/1996 | Muller et al. | |
| 5,498,489 A | 3/1996 | Dasgupta et al. | |
| 5,499,207 A | 3/1996 | Miki et al. | |
| 5,501,918 A | 3/1996 | Gruenstern et al. | |
| 5,504,041 A | 4/1996 | Summerfelt | |
| 5,512,147 A | 4/1996 | Bates et al. | |
| 5,512,387 A | 4/1996 | Ovshinsky | |
| 5,512,389 A | 4/1996 | Dasgupta et al. | |
| 5,538,796 A | 7/1996 | Schaffer et al. | |
| 5,540,742 A | 7/1996 | Sangyoji et al. | |
| 5,547,780 A | 8/1996 | Kagawa et al. | |
| 5,547,781 A | 8/1996 | Blonsky et al. | |
| 5,547,782 A | 8/1996 | Dasgupta et al. | |
| 5,552,242 A | 9/1996 | Ovshinsky et al. | |
| 5,555,127 A | 9/1996 | Abdelkader et al. | |
| 5,561,004 A | 10/1996 | Bates et al. | |
| 5,563,979 A | 10/1996 | Bruce et al. | |
| 5,565,071 A | 10/1996 | Demaray et al. | |
| 5,567,210 A | 10/1996 | Bates et al. | |
| 5,569,520 A | 10/1996 | Bates | |
| 5,582,935 A | 12/1996 | Dasgupta et al. | |
| 5,591,520 A | 1/1997 | Migliorini et al. | |
| 5,597,660 A | 1/1997 | Bates et al. | |
| 5,597,661 A | 1/1997 | Takeuchi et al. | |

(56) References Cited

U.S. PATENT DOCUMENTS

| | | | |
|---|---|---|---|
| 5,599,355 A | 2/1997 | Nagasubramanian et al. |
| 5,601,952 A | 2/1997 | Dasgupta et al. |
| 5,603,816 A | 2/1997 | Demaray et al. |
| 5,607,560 A | 3/1997 | Hirabayashi et al. |
| 5,607,789 A | 3/1997 | Treger et al. |
| 5,612,152 A | 3/1997 | Bates et al. |
| 5,612,153 A | 3/1997 | Moulton et al. |
| 5,613,995 A | 3/1997 | Bhandarkar et al. |
| 5,616,933 A | 4/1997 | Li |
| 5,618,382 A * | 4/1997 | Mintz et al. .................. 216/64 |
| 5,625,202 A | 4/1997 | Chai |
| 5,637,418 A | 6/1997 | Brown et al. |
| 5,643,480 A | 7/1997 | Gustavsson et al. |
| 5,644,207 A | 7/1997 | Lew et al. |
| 5,645,626 A | 7/1997 | Edlund et al. |
| 5,645,960 A | 7/1997 | Scrosati et al. |
| 5,654,054 A | 8/1997 | Tropsha et al. |
| 5,654,984 A | 8/1997 | Hershbarger et al. |
| 5,658,652 A | 8/1997 | Sellergren |
| 5,660,700 A | 8/1997 | Shimizu et al. |
| 5,665,490 A | 9/1997 | Takeuchi et al. |
| 5,667,538 A | 9/1997 | Bailey |
| 5,677,784 A | 10/1997 | Harris |
| 5,679,980 A | 10/1997 | Summerfelt |
| 5,681,666 A | 10/1997 | Treger et al. |
| 5,686,360 A | 11/1997 | Harvey, III et al. |
| 5,689,522 A | 11/1997 | Beach |
| 5,693,956 A | 12/1997 | Shi et al. |
| 5,702,829 A | 12/1997 | Paidassi et al. |
| 5,705,293 A | 1/1998 | Hobson |
| 5,716,728 A | 2/1998 | Smesko |
| 5,718,813 A | 2/1998 | Drummond et al. |
| 5,719,976 A | 2/1998 | Henry et al. |
| 5,721,067 A | 2/1998 | Jacobs et al. |
| RE35,746 E | 3/1998 | Lake |
| 5,731,661 A | 3/1998 | So et al. |
| 5,738,731 A | 4/1998 | Shindo et al. |
| 5,742,094 A | 4/1998 | Ting |
| 5,755,938 A | 5/1998 | Fukui et al. |
| 5,755,940 A | 5/1998 | Shindo |
| 5,757,126 A | 5/1998 | Harvey, III et al. |
| 5,762,768 A | 6/1998 | Goy et al. |
| 5,763,058 A | 6/1998 | Isen et al. |
| 5,771,562 A | 6/1998 | Harvey, III et al. |
| 5,776,278 A | 7/1998 | Tuttle et al. |
| 5,779,839 A | 7/1998 | Tuttle et al. |
| 5,790,489 A | 8/1998 | O'Connor |
| 5,792,550 A | 8/1998 | Phillips et al. |
| 5,805,223 A | 9/1998 | Shikakura et al. |
| 5,811,177 A | 9/1998 | Shi et al. |
| 5,814,195 A | 9/1998 | Lehan et al. |
| 5,830,330 A | 11/1998 | Lantsman |
| 5,831,262 A | 11/1998 | Greywall et al. |
| 5,834,137 A | 11/1998 | Zhang et al. |
| 5,841,931 A | 11/1998 | Foresi et al. |
| 5,842,118 A | 11/1998 | Wood, Jr. |
| 5,845,990 A | 12/1998 | Hymer |
| 5,847,865 A | 12/1998 | Gopinath et al. |
| 5,849,163 A | 12/1998 | Ichikawa et al. |
| 5,851,896 A | 12/1998 | Summerfelt |
| 5,853,830 A | 12/1998 | McCaulley et al. |
| 5,855,744 A | 1/1999 | Halsey et al. |
| 5,856,705 A | 1/1999 | Ting |
| 5,864,182 A | 1/1999 | Matsuzaki |
| 5,865,860 A | 2/1999 | Delnick |
| 5,870,273 A | 2/1999 | Sogabe et al. |
| 5,874,184 A | 2/1999 | Takeuchi et al. |
| 5,882,721 A | 3/1999 | Delnick |
| 5,882,946 A | 3/1999 | Otani |
| 5,889,383 A | 3/1999 | Teich |
| 5,895,731 A | 4/1999 | Clingempeel |
| 5,897,522 A | 4/1999 | Nitzan |
| 5,900,057 A | 5/1999 | Buchal et al. |
| 5,909,346 A | 6/1999 | Malhotra et al. |
| 5,916,704 A | 6/1999 | Lewin et al. |
| 5,923,964 A | 7/1999 | Li |
| 5,930,046 A | 7/1999 | Solberg et al. |
| 5,930,584 A | 7/1999 | Sun et al. |
| 5,942,089 A | 8/1999 | Sproul et al. |
| 5,948,215 A | 9/1999 | Lantsman |
| 5,948,464 A | 9/1999 | Delnick |
| 5,948,562 A | 9/1999 | Fulcher et al. |
| 5,952,778 A | 9/1999 | Haskal et al. |
| 5,955,217 A | 9/1999 | Lerberghe |
| 5,961,672 A | 10/1999 | Skotheim et al. |
| 5,961,682 A | 10/1999 | Lee et al. |
| 5,966,491 A | 10/1999 | DiGiovanni |
| 5,970,393 A | 10/1999 | Khorrami et al. |
| 5,973,913 A | 10/1999 | McEwen et al. |
| 5,977,582 A | 11/1999 | Fleming et al. |
| 5,982,144 A | 11/1999 | Johnson et al. |
| 5,985,484 A | 11/1999 | Young et al. |
| 5,985,485 A | 11/1999 | Ovshinsky et al. |
| 6,000,603 A | 12/1999 | Koskenmaki et al. |
| 6,001,224 A | 12/1999 | Drummond et al. |
| 6,004,660 A | 12/1999 | Topolski et al. |
| 6,007,945 A | 12/1999 | Jacobs et al. |
| 6,013,949 A | 1/2000 | Tuttle |
| 6,019,284 A | 2/2000 | Freeman et al. |
| 6,023,610 A | 2/2000 | Wood, Jr. |
| 6,024,844 A | 2/2000 | Drummond et al. |
| 6,025,094 A | 2/2000 | Visco et al. |
| 6,028,990 A | 2/2000 | Shahani et al. |
| 6,030,421 A | 2/2000 | Gauthier et al. |
| 6,033,768 A * | 3/2000 | Muenz et al. .................. 428/216 |
| 6,042,965 A | 3/2000 | Nestler et al. |
| 6,045,626 A | 4/2000 | Yano et al. |
| 6,045,652 A | 4/2000 | Tuttle et al. |
| 6,045,942 A | 4/2000 | Miekka et al. |
| 6,046,081 A | 4/2000 | Kuo |
| 6,046,514 A | 4/2000 | Rouillard et al. |
| 6,048,372 A | 4/2000 | Mangahara et al. |
| 6,051,114 A | 4/2000 | Yao et al. |
| 6,051,296 A | 4/2000 | McCaulley et al. |
| 6,052,397 A | 4/2000 | Jeon et al. |
| 6,057,557 A | 5/2000 | Ichikawa |
| 6,058,233 A | 5/2000 | Dragone |
| 6,071,323 A | 6/2000 | Kawaguchi |
| 6,075,973 A | 6/2000 | Greeff et al. |
| 6,077,106 A | 6/2000 | Mish |
| 6,077,642 A | 6/2000 | Ogata et al. |
| 6,078,791 A | 6/2000 | Tuttle et al. |
| 6,080,508 A | 6/2000 | Dasgupta et al. |
| 6,080,643 A | 6/2000 | Noguchi et al. |
| 6,093,944 A | 7/2000 | VanDover |
| 6,094,292 A | 7/2000 | Goldner et al. |
| 6,096,569 A | 8/2000 | Matsuno et al. |
| 6,100,108 A | 8/2000 | Mizuno et al. |
| 6,106,933 A | 8/2000 | Nagai et al. |
| 6,110,531 A | 8/2000 | Paz De Araujo |
| 6,115,616 A | 9/2000 | Halperin et al. |
| 6,117,279 A | 9/2000 | Smolanoff et al. |
| 6,118,426 A | 9/2000 | Albert et al. |
| 6,120,890 A | 9/2000 | Chen et al. |
| 6,129,277 A | 10/2000 | Grant et al. |
| 6,133,670 A | 10/2000 | Rodgers et al. |
| 6,137,671 A | 10/2000 | Staffiere |
| 6,144,916 A | 11/2000 | Wood, Jr. et al. |
| 6,146,225 A | 11/2000 | Sheats et al. |
| 6,148,503 A | 11/2000 | Delnick et al. |
| 6,156,452 A | 12/2000 | Kozuki et al. |
| 6,157,765 A | 12/2000 | Bruce et al. |
| 6,159,635 A | 12/2000 | Dasgupta et al. |
| 6,160,373 A | 12/2000 | Dunn et al. |
| 6,162,709 A | 12/2000 | Raoux et al. |
| 6,165,566 A | 12/2000 | Tropsha |
| 6,168,884 B1 | 1/2001 | Neudecker et al. |
| 6,169,474 B1 | 1/2001 | Greeff et al. |
| 6,175,075 B1 | 1/2001 | Shiotsuka et al. |
| 6,176,986 B1 | 1/2001 | Watanabe et al. |
| 6,181,283 B1 | 1/2001 | Johnson et al. |
| 6,192,222 B1 | 2/2001 | Greeff et al. |
| 6,197,167 B1 | 3/2001 | Tanaka |
| 6,198,217 B1 | 3/2001 | Suzuki et al. |

(56) References Cited

U.S. PATENT DOCUMENTS

| | | |
|---|---|---|
| 6,204,111 B1 | 3/2001 | Uemoto et al. |
| 6,210,544 B1 | 4/2001 | Sasaki |
| 6,210,832 B1 | 4/2001 | Visco et al. |
| 6,214,061 B1 | 4/2001 | Visco et al. |
| 6,214,660 B1 | 4/2001 | Uemoto et al. |
| 6,218,049 B1 | 4/2001 | Bates et al. |
| 6,220,516 B1 | 4/2001 | Tuttle et al. |
| 6,223,317 B1 | 4/2001 | Pax et al. |
| 6,228,532 B1 | 5/2001 | Tsuji et al. |
| 6,229,987 B1 | 5/2001 | Greeff et al. |
| 6,232,242 B1 | 5/2001 | Hata et al. |
| 6,235,432 B1 | 5/2001 | Kono et al. |
| 6,236,793 B1 | 5/2001 | Lawrence et al. |
| 6,242,128 B1 | 6/2001 | Tura et al. |
| 6,242,129 B1 | 6/2001 | Johnson |
| 6,242,132 B1 | 6/2001 | Neudecker et al. |
| 6,248,291 B1 | 6/2001 | Nakagama et al. |
| 6,248,481 B1 | 6/2001 | Visco et al. |
| 6,248,640 B1 | 6/2001 | Nam |
| 6,249,222 B1 | 6/2001 | Gehlot |
| 6,252,564 B1 | 6/2001 | Albert et al. |
| 6,258,252 B1 | 7/2001 | Miyasaka et al. |
| 6,261,917 B1 | 7/2001 | Quek et al. |
| 6,264,709 B1 | 7/2001 | Yoon et al. |
| 6,265,652 B1 | 7/2001 | Kurata et al. |
| 6,268,695 B1 | 7/2001 | Affinito |
| 6,271,053 B1 | 8/2001 | Kondo |
| 6,271,793 B1 | 8/2001 | Brady et al. |
| 6,271,801 B2 | 8/2001 | Tuttle et al. |
| 6,280,585 B1 | 8/2001 | Obinata |
| 6,280,875 B1 | 8/2001 | Kwak et al. |
| 6,281,142 B1 | 8/2001 | Basceri |
| 6,284,406 B1 | 9/2001 | Xing et al. |
| 6,287,986 B1 | 9/2001 | Mihara |
| 6,289,209 B1 | 9/2001 | Wood, Jr. |
| 6,290,821 B1 | 9/2001 | McLeod |
| 6,290,822 B1 | 9/2001 | Fleming et al. |
| 6,291,098 B1 | 9/2001 | Shibuya et al. |
| 6,294,722 B1 | 9/2001 | Kondo et al. |
| 6,296,949 B1 | 10/2001 | Bergstresser et al. |
| 6,296,967 B1 | 10/2001 | Jacobs et al. |
| 6,296,971 B1 | 10/2001 | Hara |
| 6,300,215 B1 | 10/2001 | Shin |
| 6,302,939 B1 | 10/2001 | Rabin |
| 6,306,265 B1 | 10/2001 | Fu et al. |
| 6,316,563 B2 | 11/2001 | Naijo et al. |
| 6,323,416 B1 | 11/2001 | Komori et al. |
| 6,324,211 B1 | 11/2001 | Ovard et al. |
| 6,325,294 B2 | 12/2001 | Tuttle et al. |
| 6,329,213 B1 | 12/2001 | Tuttle et al. |
| 6,339,236 B1 | 1/2002 | Tomii et al. |
| 6,340,880 B1 | 1/2002 | Higashijima et al. |
| 6,344,366 B1 | 2/2002 | Bates |
| 6,344,419 B1 | 2/2002 | Forster et al. |
| 6,344,795 B1 | 2/2002 | Gehlot |
| 6,350,353 B2 | 2/2002 | Gopalraja et al. |
| 6,351,630 B2 | 2/2002 | Wood, Jr. |
| 6,356,230 B1 | 3/2002 | Greeff et al. |
| 6,356,694 B1 | 3/2002 | Weber |
| 6,356,764 B1 | 3/2002 | Ovard et al. |
| 6,358,810 B1 | 3/2002 | Dornfest et al. |
| 6,360,954 B1 | 3/2002 | Barnardo |
| 6,361,662 B1 | 3/2002 | Chiba et al. |
| 6,365,300 B1 | 4/2002 | Ota et al. |
| 6,365,319 B1 | 4/2002 | Heath et al. |
| 6,368,275 B1 | 4/2002 | Sliwa et al. |
| 6,369,316 B1 | 4/2002 | Plessing et al. |
| 6,372,383 B1 | 4/2002 | Lee et al. |
| 6,372,386 B1 | 4/2002 | Cho et al. |
| 6,373,224 B1 | 4/2002 | Goto et al. |
| 6,375,780 B1 | 4/2002 | Tuttle et al. |
| 6,376,027 B1 | 4/2002 | Lee et al. |
| 6,379,835 B1 | 4/2002 | Kucherovsky et al. |
| 6,379,842 B1 | 4/2002 | Mayer |
| 6,379,846 B1 | 4/2002 | Terahara et al. |
| 6,380,477 B1 | 4/2002 | Curtin |
| 6,384,573 B1 | 5/2002 | Dunn |
| 6,387,563 B1 | 5/2002 | Bates |
| 6,391,166 B1 | 5/2002 | Wang |
| 6,392,565 B1 | 5/2002 | Brown |
| 6,394,598 B1 | 5/2002 | Kaiser |
| 6,395,430 B1 | 5/2002 | Cho et al. |
| 6,396,001 B1 | 5/2002 | Nakamura |
| 6,398,824 B1 | 6/2002 | Johnson |
| 6,399,241 B1 | 6/2002 | Hara et al. |
| 6,402,039 B1 | 6/2002 | Freeman et al. |
| 6,402,795 B1 | 6/2002 | Chu et al. |
| 6,402,796 B1 | 6/2002 | Johnson |
| 6,409,965 B1 | 6/2002 | Nagata et al. |
| 6,413,284 B1 | 7/2002 | Chu et al. |
| 6,413,285 B1 | 7/2002 | Chu et al. |
| 6,413,382 B1 | 7/2002 | Wang et al. |
| 6,413,645 B1 | 7/2002 | Graff et al. |
| 6,413,676 B1 | 7/2002 | Munshi |
| 6,414,626 B1 | 7/2002 | Greeff et al. |
| 6,416,598 B1 | 7/2002 | Sircar |
| 6,420,961 B1 | 7/2002 | Bates et al. |
| 6,422,698 B2 | 7/2002 | Kaiser |
| 6,423,106 B1 | 7/2002 | Bates |
| 6,423,776 B1 | 7/2002 | Akkapeddi et al. |
| 6,426,163 B1 | 7/2002 | Pasquier et al. |
| 6,432,577 B1 | 8/2002 | Shul et al. |
| 6,432,584 B1 | 8/2002 | Visco et al. |
| 6,433,380 B2 | 8/2002 | Shin |
| 6,433,465 B1 | 8/2002 | McKnight et al. |
| 6,436,156 B1 | 8/2002 | Wandeloski et al. |
| 6,437,231 B2 | 8/2002 | Kurata et al. |
| 6,444,336 B1 | 9/2002 | Jia et al. |
| 6,444,355 B1 | 9/2002 | Murai et al. |
| 6,444,368 B1 | 9/2002 | Hikmet et al. |
| 6,444,750 B1 | 9/2002 | Touhsaent |
| 6,459,418 B1 | 10/2002 | Comiskey et al. |
| 6,459,726 B1 | 10/2002 | Ovard et al. |
| 6,466,771 B2 | 10/2002 | Wood, Jr. |
| 6,475,668 B1 | 11/2002 | Hosokawa et al. |
| 6,480,699 B1 | 11/2002 | Lovoi |
| 6,481,623 B1 | 11/2002 | Grant et al. |
| 6,488,822 B1 | 12/2002 | Moslehi |
| 6,494,999 B1 | 12/2002 | Herrera et al. |
| 6,495,283 B1 | 12/2002 | Yoon et al. |
| 6,497,598 B2 | 12/2002 | Affinito |
| 6,500,287 B1 | 12/2002 | Azens et al. |
| 6,503,661 B1 | 1/2003 | Park et al. |
| 6,503,831 B2 | 1/2003 | Speakman |
| 6,506,289 B2 | 1/2003 | Demaray et al. |
| 6,511,516 B1 | 1/2003 | Johnson et al. |
| 6,511,615 B1 | 1/2003 | Dawes et al. |
| 6,517,968 B2 | 2/2003 | Johnson et al. |
| 6,522,067 B1 | 2/2003 | Graff et al. |
| 6,524,466 B1 | 2/2003 | Bonaventura et al. |
| 6,524,750 B1 | 2/2003 | Mansuetto |
| 6,525,976 B1 | 2/2003 | Johnson |
| 6,528,212 B1 | 3/2003 | Kusumoto et al. |
| 6,529,827 B1 | 3/2003 | Beason et al. |
| 6,533,907 B2 | 3/2003 | Demaray et al. |
| 6,537,428 B1 | 3/2003 | Xiong et al. |
| 6,538,211 B2 | 3/2003 | St. Lawrence et al. |
| 6,541,147 B1 | 4/2003 | McLean et al. |
| 6,548,912 B1 | 4/2003 | Graff et al. |
| 6,551,745 B2 | 4/2003 | Moutsios et al. |
| 6,558,836 B1 | 5/2003 | Whitacre et al. |
| 6,562,513 B1 | 5/2003 | Takeuchi et al. |
| 6,563,998 B1 | 5/2003 | Farah et al. |
| 6,569,564 B1 | 5/2003 | Lane |
| 6,569,570 B2 | 5/2003 | Sonobe et al. |
| 6,570,325 B2 | 5/2003 | Graff et al. |
| 6,572,173 B2 | 6/2003 | Muller |
| 6,573,652 B1 | 6/2003 | Graff et al. |
| 6,576,546 B2 | 6/2003 | Gilbert et al. |
| 6,579,728 B2 | 6/2003 | Grant et al. |
| 6,582,480 B2 | 6/2003 | Pasquier et al. |
| 6,582,481 B1 | 6/2003 | Erbil |
| 6,582,852 B1 | 6/2003 | Gao et al. |
| 6,589,299 B2 | 7/2003 | Missling et al. |

(56) References Cited

U.S. PATENT DOCUMENTS

| | | |
|---|---|---|
| 6,593,150 B2 | 7/2003 | Ramberg et al. |
| 6,599,662 B1 | 7/2003 | Chiang et al. |
| 6,600,905 B2 | 7/2003 | Greeff et al. |
| 6,602,338 B2 | 8/2003 | Chen et al. |
| 6,603,139 B1 | 8/2003 | Tessler et al. |
| 6,603,391 B1 | 8/2003 | Greeff et al. |
| 6,605,228 B1 | 8/2003 | Kawaguchi et al. |
| 6,608,464 B1 | 8/2003 | Lew et al. |
| 6,608,470 B1 | 8/2003 | Oglesbee et al. |
| 6,610,440 B1 | 8/2003 | LaFollette et al. |
| 6,615,614 B1 | 9/2003 | Makikawa et al. |
| 6,616,035 B2 | 9/2003 | Ehrensvard et al. |
| 6,618,829 B2 | 9/2003 | Pax et al. |
| 6,620,545 B2 | 9/2003 | Goenka et al. |
| 6,622,049 B2 | 9/2003 | Penner et al. |
| 6,632,563 B1 | 10/2003 | Krasnov et al. |
| 6,637,906 B2 | 10/2003 | Knoerzer et al. |
| 6,637,916 B2 | 10/2003 | Mullner |
| 6,639,578 B1 | 10/2003 | Comiskey et al. |
| 6,642,895 B2 | 11/2003 | Zurcher et al. |
| 6,645,675 B1 | 11/2003 | Munshi |
| 6,650,000 B2 | 11/2003 | Ballantine et al. |
| 6,650,942 B2 | 11/2003 | Howard et al. |
| 6,662,430 B2 | 12/2003 | Brady et al. |
| 6,664,006 B1 | 12/2003 | Munshi |
| 6,673,484 B2 | 1/2004 | Matsuura |
| 6,673,716 B1 | 1/2004 | D'Couto et al. |
| 6,674,159 B1 | 1/2004 | Peterson et al. |
| 6,677,070 B2 | 1/2004 | Kearl |
| 6,683,244 B2 | 1/2004 | Fujimori et al. |
| 6,683,749 B2 | 1/2004 | Daby et al. |
| 6,686,096 B1 | 2/2004 | Chung |
| 6,693,840 B2 | 2/2004 | Shimada et al. |
| 6,700,491 B2 | 3/2004 | Shafer |
| 6,706,449 B2 | 3/2004 | Mikhaylik et al. |
| 6,709,778 B2 | 3/2004 | Johnson |
| 6,713,216 B2 | 3/2004 | Kugai et al. |
| 6,713,389 B2 | 3/2004 | Speakman |
| 6,713,987 B2 | 3/2004 | Krasnov et al. |
| 6,723,140 B2 | 4/2004 | Chu et al. |
| 6,730,423 B2 | 5/2004 | Einhart et al. |
| 6,733,924 B1 | 5/2004 | Skotheim et al. |
| 6,737,197 B2 | 5/2004 | Chu et al. |
| 6,737,789 B2 | 5/2004 | Radziemski et al. |
| 6,741,178 B1 | 5/2004 | Tuttle |
| 6,750,156 B2 | 6/2004 | Le et al. |
| 6,752,842 B2 | 6/2004 | Luski et al. |
| 6,753,108 B1 | 6/2004 | Hampden-Smith et al. |
| 6,753,114 B2 | 6/2004 | Jacobs et al. |
| 6,760,520 B1 | 7/2004 | Medin et al. |
| 6,764,525 B1 | 7/2004 | Whitacre et al. |
| 6,768,246 B2 | 7/2004 | Pelrine et al. |
| 6,768,855 B1 | 7/2004 | Bakke et al. |
| 6,770,176 B2 | 8/2004 | Benson et al. |
| 6,773,848 B1 | 8/2004 | Nortoft et al. |
| 6,780,208 B2 | 8/2004 | Hopkins et al. |
| 6,797,428 B1 | 9/2004 | Skotheim et al. |
| 6,797,429 B1 | 9/2004 | Komatsu |
| 6,805,998 B2 | 10/2004 | Jenson et al. |
| 6,805,999 B2 | 10/2004 | Lee et al. |
| 6,818,356 B1 * | 11/2004 | Bates ............................ 429/322 |
| 6,822,157 B2 | 11/2004 | Fujioka |
| 6,824,922 B2 | 11/2004 | Park et al. |
| 6,827,826 B2 | 12/2004 | Demaray et al. |
| 6,828,063 B2 | 12/2004 | Park et al. |
| 6,828,065 B2 | 12/2004 | Munshi |
| 6,830,846 B2 | 12/2004 | Kramlich et al. |
| 6,835,493 B2 | 12/2004 | Zhang et al. |
| 6,838,209 B2 | 1/2005 | Langan et al. |
| 6,846,765 B2 | 1/2005 | Imamura et al. |
| 6,852,139 B2 | 2/2005 | Zhang et al. |
| 6,855,441 B1 | 2/2005 | Levanon |
| 6,861,821 B2 | 3/2005 | Masumoto et al. |
| 6,863,699 B1 | 3/2005 | Krasnov et al. |
| 6,866,901 B2 | 3/2005 | Burrows et al. |
| 6,866,963 B2 | 3/2005 | Seung et al. |
| 6,869,722 B2 | 3/2005 | Kearl |
| 6,884,327 B2 | 4/2005 | Pan et al. |
| 6,886,240 B2 | 5/2005 | Zhang et al. |
| 6,890,385 B2 | 5/2005 | Tsuchiya et al. |
| 6,896,992 B2 | 5/2005 | Kearl |
| 6,899,975 B2 | 5/2005 | Watanabe et al. |
| 6,902,660 B2 | 6/2005 | Lee et al. |
| 6,905,578 B1 | 6/2005 | Moslehi et al. |
| 6,906,436 B2 | 6/2005 | Jenson et al. |
| 6,911,667 B2 | 6/2005 | Pichler et al. |
| 6,916,679 B2 | 7/2005 | Snyder et al. |
| 6,921,464 B2 | 7/2005 | Krasnov et al. |
| 6,923,702 B2 | 8/2005 | Graff et al. |
| 6,924,164 B2 | 8/2005 | Jenson |
| 6,929,879 B2 | 8/2005 | Yamazaki |
| 6,936,377 B2 | 8/2005 | Wensley et al. |
| 6,936,381 B2 | 8/2005 | Skotheim et al. |
| 6,936,407 B2 | 8/2005 | Pichler |
| 6,949,389 B2 | 9/2005 | Pichler et al. |
| 6,955,986 B2 | 10/2005 | Li |
| 6,962,613 B2 | 11/2005 | Jenson |
| 6,962,671 B2 | 11/2005 | Martin et al. |
| 6,964,829 B2 | 11/2005 | Utsugi et al. |
| 6,982,132 B1 | 1/2006 | Goldner et al. |
| 6,986,965 B2 | 1/2006 | Jenson et al. |
| 6,994,933 B1 | 2/2006 | Bates |
| 7,022,431 B2 | 4/2006 | Shchori et al. |
| 7,033,406 B2 | 4/2006 | Weir et al. |
| 7,045,246 B2 | 5/2006 | Simburger et al. |
| 7,045,372 B2 | 5/2006 | Ballantine et al. |
| 7,056,620 B2 | 6/2006 | Krasnov et al. |
| 7,073,723 B2 | 7/2006 | Fürst et al. |
| 7,095,372 B2 | 8/2006 | Soler Castany et al. |
| 7,129,166 B2 | 10/2006 | Speakman |
| 7,131,189 B2 | 11/2006 | Jenson |
| 7,144,654 B2 | 12/2006 | LaFollette et al. |
| 7,144,655 B2 | 12/2006 | Jenson et al. |
| 7,157,187 B2 | 1/2007 | Jenson |
| 7,158,031 B2 | 1/2007 | Tuttle |
| 7,162,392 B2 | 1/2007 | Vock et al. |
| 7,183,693 B2 | 2/2007 | Brantner et al. |
| 7,186,479 B2 | 3/2007 | Krasnov et al. |
| 7,194,801 B2 | 3/2007 | Jenson et al. |
| 7,198,832 B2 | 4/2007 | Burrows et al. |
| 7,202,825 B2 | 4/2007 | Leizerovich et al. |
| 7,220,517 B2 | 5/2007 | Park et al. |
| 7,230,321 B2 | 6/2007 | McCain |
| 7,247,408 B2 | 7/2007 | Skotheim et al. |
| 7,253,494 B2 | 8/2007 | Mino et al. |
| 7,265,674 B2 | 9/2007 | Tuttle |
| 7,267,904 B2 | 9/2007 | Komatsu et al. |
| 7,267,906 B2 | 9/2007 | Mizuta et al. |
| 7,273,682 B2 | 9/2007 | Park et al. |
| 7,274,118 B2 | 9/2007 | Jenson et al. |
| 7,288,340 B2 | 10/2007 | Iwamoto |
| 7,316,867 B2 | 1/2008 | Park et al. |
| 7,323,634 B2 | 1/2008 | Speakman |
| 7,332,363 B2 | 2/2008 | Edwards |
| 7,335,441 B2 | 2/2008 | Luski et al. |
| RE40,137 E | 3/2008 | Tuttle et al. |
| 7,345,647 B1 | 3/2008 | Rodenbeck |
| 7,348,099 B2 | 3/2008 | Mukai et al. |
| 7,389,580 B2 | 6/2008 | Jenson et al. |
| 7,400,253 B2 | 7/2008 | Cohen |
| 7,410,730 B2 | 8/2008 | Bates |
| RE40,531 E | 10/2008 | Graff et al. |
| 7,466,274 B2 | 12/2008 | Lin et al. |
| 7,468,221 B2 | 12/2008 | LaFollette et al. |
| 7,494,742 B2 | 2/2009 | Tarnowski et al. |
| 7,670,724 B1 | 3/2010 | Chan et al. |
| 7,848,715 B2 | 12/2010 | Boos |
| 7,858,223 B2 * | 12/2010 | Visco et al. ................... 429/137 |
| 8,010,048 B2 | 8/2011 | Brommer et al. |
| 8,056,814 B2 | 11/2011 | Martin et al. |
| 2001/0005561 A1 | 6/2001 | Yamada et al. |
| 2001/0027159 A1 | 10/2001 | Kaneyoshi |
| 2001/0031122 A1 | 10/2001 | Lackritz et al. |
| 2001/0032666 A1 | 10/2001 | Jenson et al. |

(56) References Cited

U.S. PATENT DOCUMENTS

| | | | |
|---|---|---|---|
| 2001/0033952 A1 | 10/2001 | Jenson et al. | |
| 2001/0034106 A1 | 10/2001 | Moise et al. | |
| 2001/0041294 A1 | 11/2001 | Chu et al. | |
| 2001/0041460 A1 | 11/2001 | Wiggins | |
| 2001/0052752 A1 | 12/2001 | Ghosh et al. | |
| 2001/0054437 A1 | 12/2001 | Komori et al. | |
| 2001/0055719 A1 | 12/2001 | Akashi et al. | |
| 2002/0000034 A1 | 1/2002 | Jenson | |
| 2002/0001746 A1 | 1/2002 | Jenson | |
| 2002/0001747 A1 | 1/2002 | Jenson | |
| 2002/0004167 A1 | 1/2002 | Jenson et al. | |
| 2002/0009630 A1 | 1/2002 | Gao et al. | |
| 2002/0019296 A1 | 2/2002 | Freeman et al. | |
| 2002/0028377 A1 | 3/2002 | Gross | |
| 2002/0033330 A1 | 3/2002 | Demaray et al. | |
| 2002/0037756 A1 | 3/2002 | Jacobs et al. | |
| 2002/0066539 A1 | 6/2002 | Muller | |
| 2002/0067615 A1 | 6/2002 | Muller | |
| 2002/0071989 A1 | 6/2002 | Verma et al. | |
| 2002/0076133 A1 | 6/2002 | Li et al. | |
| 2002/0091929 A1 | 7/2002 | Ehrensvard | |
| 2002/0093029 A1 | 7/2002 | Ballantine et al. | |
| 2002/0106297 A1 | 8/2002 | Ueno et al. | |
| 2002/0110733 A1 | 8/2002 | Johnson | |
| 2002/0115252 A1 | 8/2002 | Haukka et al. | |
| 2002/0134671 A1 | 9/2002 | Demaray et al. | |
| 2002/0139662 A1 | 10/2002 | Lee | |
| 2002/0140103 A1 | 10/2002 | Kloster et al. | |
| 2002/0159245 A1 | 10/2002 | Murasko et al. | |
| 2002/0161404 A1 | 10/2002 | Schmidt | |
| 2002/0164441 A1 | 11/2002 | Amine et al. | |
| 2002/0170821 A1 | 11/2002 | Sandlin et al. | |
| 2002/0170960 A1 | 11/2002 | Ehrensvard et al. | |
| 2003/0019326 A1 | 1/2003 | Han et al. | |
| 2003/0022487 A1 | 1/2003 | Yoon et al. | |
| 2003/0024994 A1 | 2/2003 | Ladyansky | |
| 2003/0029493 A1 | 2/2003 | Plessing | |
| 2003/0030589 A1 | 2/2003 | Zurcher et al. | |
| 2003/0035906 A1 | 2/2003 | Memarian et al. | |
| 2003/0036003 A1 | 2/2003 | Shchori et al. | |
| 2003/0038028 A1* | 2/2003 | Schultheis et al. | ........ 204/298.13 |
| 2003/0042131 A1 | 3/2003 | Johnson | |
| 2003/0044665 A1 | 3/2003 | Rastegar et al. | |
| 2003/0048635 A1 | 3/2003 | Knoerzer et al. | |
| 2003/0063883 A1 | 4/2003 | Demaray et al. | |
| 2003/0064292 A1 | 4/2003 | Neudecker et al. | |
| 2003/0068559 A1 | 4/2003 | Armstrong et al. | |
| 2003/0076642 A1 | 4/2003 | Shiner et al. | |
| 2003/0077914 A1 | 4/2003 | Le et al. | |
| 2003/0079838 A1 | 5/2003 | Brcka | |
| 2003/0091904 A1 | 5/2003 | Munshi | |
| 2003/0095463 A1 | 5/2003 | Shimada et al. | |
| 2003/0097858 A1 | 5/2003 | Strohhofer et al. | |
| 2003/0109903 A1 | 6/2003 | Berrang et al. | |
| 2003/0118897 A1 | 6/2003 | Mino et al. | |
| 2003/0127319 A1 | 7/2003 | Demaray et al. | |
| 2003/0134054 A1 | 7/2003 | Demaray et al. | |
| 2003/0141186 A1 | 7/2003 | Wang et al. | |
| 2003/0143853 A1 | 7/2003 | Celii et al. | |
| 2003/0146877 A1 | 8/2003 | Mueller | |
| 2003/0152829 A1 | 8/2003 | Zhang et al. | |
| 2003/0162094 A1 | 8/2003 | Lee et al. | |
| 2003/0173207 A1 | 9/2003 | Zhang et al. | |
| 2003/0173208 A1 | 9/2003 | Pan et al. | |
| 2003/0174391 A1 | 9/2003 | Pan et al. | |
| 2003/0175142 A1 | 9/2003 | Milonopoulou et al. | |
| 2003/0178623 A1 | 9/2003 | Nishiki et al. | |
| 2003/0178637 A1 | 9/2003 | Chen et al. | |
| 2003/0180610 A1 | 9/2003 | Felde et al. | |
| 2003/0185266 A1 | 10/2003 | Henrichs | |
| 2003/0231106 A1 | 12/2003 | Shafer | |
| 2003/0232248 A1 | 12/2003 | Iwamoto et al. | |
| 2004/0008587 A1 | 1/2004 | Siebott et al. | |
| 2004/0015735 A1 | 1/2004 | Norman | |
| 2004/0023106 A1 | 2/2004 | Benson et al. | |
| 2004/0028875 A1 | 2/2004 | Van Rijn et al. | |
| 2004/0029311 A1 | 2/2004 | Snyder et al. | |
| 2004/0038050 A1 | 2/2004 | Saijo et al. | |
| 2004/0043557 A1 | 3/2004 | Haukka et al. | |
| 2004/0048157 A1* | 3/2004 | Neudecker et al. | ........ 429/231.2 |
| 2004/0053124 A1 | 3/2004 | LaFollette et al. | |
| 2004/0058237 A1 | 3/2004 | Higuchi et al. | |
| 2004/0072067 A1 | 4/2004 | Minami et al. | |
| 2004/0077161 A1 | 4/2004 | Chen et al. | |
| 2004/0078662 A1 | 4/2004 | Hamel et al. | |
| 2004/0081415 A1 | 4/2004 | Demaray et al. | |
| 2004/0081860 A1 | 4/2004 | Hundt et al. | |
| 2004/0085002 A1 | 5/2004 | Pearce | |
| 2004/0101761 A1 | 5/2004 | Park et al. | |
| 2004/0105644 A1 | 6/2004 | Dawes | |
| 2004/0106038 A1 | 6/2004 | Shimamura et al. | |
| 2004/0106045 A1 | 6/2004 | Ugaji | |
| 2004/0106046 A1 | 6/2004 | Inda | |
| 2004/0118700 A1 | 6/2004 | Schierle-Arndt et al. | |
| 2004/0126305 A1 | 7/2004 | Chen et al. | |
| 2004/0142244 A1 | 7/2004 | Visco et al. | |
| 2004/0151986 A1 | 8/2004 | Park et al. | |
| 2004/0161640 A1 | 8/2004 | Salot | |
| 2004/0175624 A1 | 9/2004 | Luski et al. | |
| 2004/0188239 A1 | 9/2004 | Robison et al. | |
| 2004/0209159 A1 | 10/2004 | Lee et al. | |
| 2004/0212276 A1 | 10/2004 | Brantner et al. | |
| 2004/0214079 A1 | 10/2004 | Simburger et al. | |
| 2004/0219434 A1 | 11/2004 | Benson et al. | |
| 2004/0245561 A1 | 12/2004 | Sakashita et al. | |
| 2004/0258984 A1 | 12/2004 | Ariel et al. | |
| 2004/0259305 A1 | 12/2004 | Demaray et al. | |
| 2005/0000794 A1 | 1/2005 | Demaray et al. | |
| 2005/0006768 A1 | 1/2005 | Narasimhan et al. | |
| 2005/0048802 A1 | 3/2005 | Zhang et al. | |
| 2005/0070097 A1 | 3/2005 | Barmak et al. | |
| 2005/0072458 A1 | 4/2005 | Goldstein | |
| 2005/0079418 A1 | 4/2005 | Kelley et al. | |
| 2005/0095506 A1 | 5/2005 | Klaassen | |
| 2005/0105231 A1 | 5/2005 | Hamel et al. | |
| 2005/0110457 A1 | 5/2005 | LaFollette et al. | |
| 2005/0112461 A1 | 5/2005 | Amine et al. | |
| 2005/0118464 A1 | 6/2005 | Levanon | |
| 2005/0130032 A1 | 6/2005 | Krasnov et al. | |
| 2005/0133361 A1 | 6/2005 | Ding et al. | |
| 2005/0141170 A1 | 6/2005 | Honda et al. | |
| 2005/0142447 A1 | 6/2005 | Nakai et al. | |
| 2005/0147877 A1 | 7/2005 | Tarnowski et al. | |
| 2005/0158622 A1 | 7/2005 | Mizuta et al. | |
| 2005/0170736 A1 | 8/2005 | Cok | |
| 2005/0175891 A1 | 8/2005 | Kameyama et al. | |
| 2005/0176181 A1 | 8/2005 | Burrows et al. | |
| 2005/0181280 A1 | 8/2005 | Ceder et al. | |
| 2005/0183946 A1 | 8/2005 | Pan et al. | |
| 2005/0189139 A1 | 9/2005 | Stole | |
| 2005/0208371 A1 | 9/2005 | Kim et al. | |
| 2005/0239917 A1 | 10/2005 | Nelson et al. | |
| 2005/0255828 A1 | 11/2005 | Fisher | |
| 2005/0266161 A1 | 12/2005 | Medeiros et al. | |
| 2006/0019504 A1 | 1/2006 | Taussig | |
| 2006/0021214 A1 | 2/2006 | Jenson et al. | |
| 2006/0021261 A1 | 2/2006 | Face | |
| 2006/0040177 A1 | 2/2006 | Onodera et al. | |
| 2006/0046907 A1 | 3/2006 | Rastegar et al. | |
| 2006/0054496 A1 | 3/2006 | Zhang et al. | |
| 2006/0057283 A1 | 3/2006 | Zhang et al. | |
| 2006/0057304 A1 | 3/2006 | Zhang et al. | |
| 2006/0063074 A1 | 3/2006 | Jenson et al. | |
| 2006/0071592 A1 | 4/2006 | Narasimhan et al. | |
| 2006/0134522 A1 | 6/2006 | Zhang et al. | |
| 2006/0155545 A1 | 7/2006 | Jayne | |
| 2006/0201583 A1 | 9/2006 | Michaluk et al. | |
| 2006/0210779 A1 | 9/2006 | Weir et al. | |
| 2006/0216611 A1* | 9/2006 | Ugaji et al. | ................ 429/322 |
| 2006/0222954 A1 | 10/2006 | Skotheim et al. | |
| 2006/0234130 A1 | 10/2006 | Inda | |
| 2006/0237543 A1 | 10/2006 | Goto et al. | |
| 2006/0255435 A1 | 11/2006 | Fuergut et al. | |
| 2006/0286448 A1 | 12/2006 | Snyder et al. | |

(56) References Cited

U.S. PATENT DOCUMENTS

| | | |
|---|---|---|
| 2007/0009802 A1 | 1/2007 | Lee et al. |
| 2007/0021156 A1 | 1/2007 | Hoong et al. |
| 2007/0023275 A1 | 2/2007 | Tanase et al. |
| 2007/0037058 A1* | 2/2007 | Visco et al. ............ 429/246 |
| 2007/0053139 A1 | 3/2007 | Zhang et al. |
| 2007/0087230 A1 | 4/2007 | Jenson et al. |
| 2007/0091543 A1 | 4/2007 | Gasse et al. |
| 2007/0125638 A1 | 6/2007 | Zhang et al. |
| 2007/0141468 A1 | 6/2007 | Barker |
| 2007/0148065 A1 | 6/2007 | Weir et al. |
| 2007/0148553 A1 | 6/2007 | Weppner |
| 2007/0151661 A1 | 7/2007 | Mao et al. |
| 2007/0164376 A1 | 7/2007 | Burrows et al. |
| 2007/0166612 A1 | 7/2007 | Krasnov et al. |
| 2007/0184345 A1 | 8/2007 | Neudecker et al. |
| 2007/0196682 A1 | 8/2007 | Visser et al. |
| 2007/0202395 A1 | 8/2007 | Snyder et al. |
| 2007/0205513 A1 | 9/2007 | Brunnbauer et al. |
| 2007/0210459 A1 | 9/2007 | Burrows et al. |
| 2007/0222681 A1 | 9/2007 | Greene et al. |
| 2007/0224951 A1 | 9/2007 | Gilb et al. |
| 2007/0229228 A1 | 10/2007 | Yamazaki et al. |
| 2007/0235320 A1* | 10/2007 | White et al. ............ 204/192.1 |
| 2007/0264564 A1 | 11/2007 | Johnson et al. |
| 2007/0278653 A1 | 12/2007 | Brunnbauer et al. |
| 2007/0298326 A1 | 12/2007 | Angell et al. |
| 2008/0003496 A1 | 1/2008 | Neudecker et al. |
| 2008/0008936 A1 | 1/2008 | Mizuta et al. |
| 2008/0014501 A1 | 1/2008 | Skotheim et al. |
| 2008/0057397 A1 | 3/2008 | Skotheim et al. |
| 2008/0150829 A1 | 6/2008 | Lin et al. |
| 2008/0213672 A1 | 9/2008 | Skotheim et al. |
| 2008/0233708 A1 | 9/2008 | Hisamatsu |
| 2008/0254575 A1 | 10/2008 | Fuergut et al. |
| 2008/0261107 A1 | 10/2008 | Snyder et al. |
| 2008/0263855 A1* | 10/2008 | Li et al. .............. 29/623.5 |
| 2008/0286651 A1 | 11/2008 | Neudecker et al. |
| 2009/0092903 A1 | 4/2009 | Johnson et al. |
| 2009/0124201 A1 | 5/2009 | Meskens |
| 2009/0181303 A1 | 7/2009 | Neudecker et al. |
| 2009/0302226 A1 | 12/2009 | Schieber et al. |
| 2009/0308936 A1 | 12/2009 | Nitzan et al. |
| 2009/0312069 A1 | 12/2009 | Peng et al. |
| 2010/0001079 A1 | 1/2010 | Martin et al. |
| 2010/0032001 A1 | 2/2010 | Brantner |
| 2010/0086853 A1 | 4/2010 | Venkatachalam et al. |
| 2011/0267235 A1 | 11/2011 | Brommer et al. |
| 2011/0304430 A1 | 12/2011 | Brommer et al. |

FOREIGN PATENT DOCUMENTS

| | | |
|---|---|---|
| DE | 19824145 | 12/1999 |
| DE | 10 2005 014 427 | 9/2006 |
| DE | 10 2006 054 309 | 11/2006 |
| DE | 10 2008 016 665 | 10/2008 |
| DE | 102007030604 | 1/2009 |
| EP | 0 510 883 | 10/1992 |
| EP | 0 639 655 | 2/1995 |
| EP | 0 652 308 | 5/1995 |
| EP | 0 820 088 | 1/1998 |
| EP | 1 068 899 | 1/2001 |
| EP | 0 867 985 | 2/2001 |
| EP | 1 092 689 | 4/2001 |
| EP | 1 189 080 | 3/2002 |
| EP | 1 713 024 | 10/2006 |
| FR | 2806198 | 9/2001 |
| FR | 2 861 218 | 4/2005 |
| JP | 55-009305 | 1/1980 |
| JP | 56-076060 | 6/1981 |
| JP | 56-156675 | 12/1981 |
| JP | 60-068558 | 4/1985 |
| JP | 61-269072 | 11/1986 |
| JP | 62-267944 | 11/1987 |
| JP | 63-290922 | 11/1988 |
| JP | 2000-162234 | 11/1988 |
| JP | 2-054764 | 2/1990 |
| JP | 2-230662 | 9/1990 |
| JP | 03-036962 | 2/1991 |
| JP | 4-058456 | 2/1992 |
| JP | 4-072049 | 3/1992 |
| JP | 6-010127 | 1/1994 |
| JP | 6-100333 | 4/1994 |
| JP | 7-233469 | 5/1995 |
| JP | 7-224379 | 8/1995 |
| JP | 08-114408 | 5/1996 |
| JP | 10-026571 | 1/1998 |
| JP | 10-239187 | 9/1998 |
| JP | 11-204088 | 7/1999 |
| JP | 2000-144435 | 5/2000 |
| JP | 2000-188099 | 7/2000 |
| JP | 2000-268867 | 9/2000 |
| JP | A 2000-294291 | 10/2000 |
| JP | 2001-171812 | 6/2001 |
| JP | 2001-259494 | 9/2001 |
| JP | 2001-297764 | 10/2001 |
| JP | 2001-328198 | 11/2001 |
| JP | 2002-140776 | 5/2002 |
| JP | 2002-344115 | 11/2002 |
| JP | 2003-17040 | 1/2003 |
| JP | 2003-347045 | 12/2003 |
| JP | 2004-071305 | 3/2004 |
| JP | 2004-149849 | 5/2004 |
| JP | 2004-158268 | 6/2004 |
| JP | A 2004-179161 | 6/2004 |
| JP | 2004-273436 | 9/2004 |
| JP | A 2004-527068 | 9/2004 |
| JP | A 2005-507544 | 3/2005 |
| JP | 2005-256101 | 9/2005 |
| JP | A 2006-120437 | 5/2006 |
| JP | 2002-026412 | 2/2007 |
| JP | 7-107752 | 4/2007 |
| JP | A 2007-188877 | 7/2007 |
| KR | 20020007881 | 1/2002 |
| KR | 20020017790 | 3/2002 |
| KR | 20020029813 | 4/2002 |
| KR | 20020038917 | 5/2002 |
| KR | 20030033913 | 5/2003 |
| KR | 20030042288 | 5/2003 |
| KR | 20030085252 | 11/2003 |
| KR | 10-2004-0098139 | 11/2004 |
| KR | 10-0533933 | 12/2005 |
| RU | 2241281 | 11/2004 |
| WO | WO 9513629 | 5/1995 |
| WO | WO 9623085 | 8/1996 |
| WO | WO 9623217 | 8/1996 |
| WO | WO 9727344 | 7/1997 |
| WO | WO 9735044 | 9/1997 |
| WO | WO 9847196 | 10/1998 |
| WO | WO 9943034 | 8/1999 |
| WO | WO 9957770 | 11/1999 |
| WO | WO 0021898 | 4/2000 |
| WO | WO 0022742 | 4/2000 |
| WO | WO 0028607 | 5/2000 |
| WO | WO 0036665 | 6/2000 |
| WO | WO 0060682 | 10/2000 |
| WO | WO 0060689 | 10/2000 |
| WO | WO 0062365 | 10/2000 |
| WO | WO 0101507 | 1/2001 |
| WO | WO 0117052 | 3/2001 |
| WO | WO 0124303 | 4/2001 |
| WO | WO 0133651 | 5/2001 |
| WO | WO 0139305 | 5/2001 |
| WO | WO 0173864 | 10/2001 |
| WO | WO 0173865 | 10/2001 |
| WO | WO 0173866 | 10/2001 |
| WO | WO 0173868 | 10/2001 |
| WO | WO 0173870 | 10/2001 |
| WO | WO 0173883 | 10/2001 |
| WO | WO 0173957 | 10/2001 |
| WO | WO 0182390 | 11/2001 |
| WO | WO 0212932 | 2/2002 |
| WO | WO 0242516 | 5/2002 |
| WO | WO 0247187 | 6/2002 |

(56) References Cited

FOREIGN PATENT DOCUMENTS

| WO | WO 02071506 | 9/2002 |
|---|---|---|
| WO | WO 02/095849 | 11/2002 |
| WO | WO 02101857 | 12/2002 |
| WO | WO 03003485 | 1/2003 |
| WO | WO 03005477 | 1/2003 |
| WO | WO 03026039 | 3/2003 |
| WO | WO 03036670 | 5/2003 |
| WO | WO 03069714 | 8/2003 |
| WO | WO 03080325 | 10/2003 |
| WO | WO 03083166 | 10/2003 |
| WO | WO 2004012283 | 2/2004 |
| WO | WO 2004021532 | 3/2004 |
| WO | WO 2004061887 | 7/2004 |
| WO | WO 2004077519 | 9/2004 |
| WO | WO 2004086550 | 10/2004 |
| WO | WO 2004093223 | 10/2004 |
| WO | WO 2004106581 | 12/2004 |
| WO | WO 2004106582 | 12/2004 |
| WO | WO 2005008828 | 1/2005 |
| WO | WO 2005013394 | 2/2005 |
| WO | WO 2005038957 | 4/2005 |
| WO | WO 2005067645 | 7/2005 |
| WO | WO 2005085138 | 9/2005 |
| WO | WO 2005091405 | 9/2005 |
| WO | WO 2006/043470 | 4/2006 |
| WO | WO 2006063308 | 6/2006 |
| WO | WO 2006085307 | 8/2006 |
| WO | WO 2007016781 | 2/2007 |
| WO | WO 2007019855 | 2/2007 |
| WO | WO 2007027535 | 3/2007 |
| WO | WO 2007-042394 A1 | 4/2007 |
| WO | WO 2007095604 | 8/2007 |
| WO | WO 2008036731 | 3/2008 |

OTHER PUBLICATIONS

Large Area Deposition by Mid-Frequency AC Sputtering R. Hill, S. Nadel and P. Petrach 1998 Society of Vacuum Coaters 505/856-7188 41st Annual Technical Conference Proceedings.*

Abraham, K.M. et al., "Inorganic-organic composite solid polymer electrolytes," 147(4) J. Electrochem. Soc. 1251-56 (2000).

Abrahams, I., "$Li_6Zr_2O_7$, a new anion vacancy ccp based structure, determined by ab initio powder diffraction methods," 104 J. Solid State Chem. 397-403 (1993).

Amatucci, G. et al., "Lithium scandium phosphate-based electrolytes for solid state lithium rechargeable microbatteries," 60 Solid State Ionics 357-65 (1993).

Appetecchi, G.B. et al., "Composite polymer electrolytes with improved lithium metal electrode interfacial properties," 145(12) J. Electrochem. Soc. 4126-32 (1998).

Bates, J.B. et al., "Electrical properties of amorphous lithium electrolyte thin films," 53-56 Solid State Ionics 647-54 (1992).

Delmas, C. et al., "Des conducteurs ioniques pseudo-bidimensionnels $Li_8MO_6$ (M = Zr, Sn), $Li_7LO_6$ (L = Nb, Ta) et $Li_6In_2O_6$," 14 Mat. Res. Bull. 619-25 (1979).

Hu, Y-W. et al., "Ionic conductivity of lithium phosphate-doped lithium orthosilicate," 11 Mat. Res. Bull. 1227-30 (1976).

Neudecker, B. et al., "$Li_9SiAlO_8$: a lithium ion electrolyte for voltages above 5.4 V," 143(7) J. Electrochem. Soc. 2198-203 (1996).

Ohno, H. et al., "Electrical conductivity of a sintered pellet of octalithium zirkonate," 132 J. Nucl. Mat. 222-30 (1985).

Scholder, V. et al., "Über Zirkonate, Hafnate und Thorate von Barium, Strontium, Lithium und Natrium," Zeitschrift für Anorganische und Allgemeine Chemie, Band 362, pp. 149-168 (1968).

Yu, X. et al., "A stable thin-film lithium electrolyte: lithium phosphorus oxynitride," 144(2) J. Electrochem. Soc. 524-532 (1997).

Sarro, P., "Silicon Carbide as a New MEMS Technology," Sensors and Actuators 82, 210-218 (2000).

Hwang et al., "Characterization of Sputter-Deposited $LiMn_2O_4$ Thin Films for Rechargeable Microbatteries," 141(12) J. Electrochem. Soc. 3296-99 (1994).

Jones et al., 53-56 Solid State Ionics 628 (1992).

Mattox "Handbook of Physical Vapor Deposition (PVD) Processing, Society of Vacuum Coaters," Albuquerque, New Mexico 660f and 692ff, Noyes Publications (1998).

Celgard, Celgard High Performance Battery Separators, Nov. 2009, 2 pages, Celgard, LLC, Charlotte, NC, U.S.A.

A. Tarniowy, The effect of thermal treatment on the structure, optical and electrical properties or amorphous titanium nitride thin films, Thin Solid Films, Apr. 27, 1997, pp. 93-100, Elsevier.

L. Pichon et al., Zirconium nitrides deposited by dual ion beam sputtering: physical properties and growth modelling, Applied Surface Science, Mar. 5, 1999, pp. 115-124, N.H Elsevier, France.

J. Adachi, Thermal and electrical properties of zirconium nitride, Journal of Alloy and Compounds, Feb. 11, 2005, pp. 242-244, Elsevier, France.

T. Starner, Human-powered wearable computing, IMB Systems Journal, May 1, 1996, pp. 618-629, vol. 35, Nos. 3&4, U.S.A.

Roh N-S et al., Effects of deposition condition on the ionic conductivity and structure of amorphous lithium phosphorus oxynitrate thin film, vol. 42, No. 1, Amesterdam, NL.

Balanis, Constantine A., "Antenna Theory: Analysis and Design," 3rd Ed., pp. 817-820 (John Wiley & Sons, Inc. Publication, 2005).

Inaguma, Yoshiyuki, "High Ionic Conductivity in Lithium Lanthanum Titanate," Solid State Communications, vol. 86, No. 10, pp. 689-693 (1993).

Guy, D., "Novel Architecture of Composite Electrode for Optimization of Lithium Battery Performance," Journal of Power Sources 157, pp. 438-442 (2006).

Wolfenstine, J., "Electrical Conductivity and Charge Compensation in Ta Doped $Li_4Ti_5O_{12}$," Journal of Power Sources 180, pp. 582-585 (2008).

Balanis, Constantine A., "Antenna Theory: Analysis and Design," 3rd Ed., pp. 811-820 (2005).

Affinito, J.D. et al., "PML/oxide/PML barrier layer performance differences arising from use of UV or electron beam polymerization of the PML layers," Thin Solid Films 308-309: 19-25 (1997).

Affinito, J.D. et al., "Polymer-oxide transparent barrier layers," Society of Vacuum Coaters, 39th Ann. Technical Conference Proceedings, May 5-10, 1996, Philadelphia, PA, pp. 392-397 (1996).

Alder, T. et al., "High-efficiency fiber-to-chip coupling using low-loss tapered single-mode fiber," IEEE Photonics Tech. Lett. 12(8): 1016-1018 (2000).

Almeida, V.R. et al., "Nanotaper for compact mode conversion," Optics Letters 28(15): 1302-1304 (2003).

Anh et al., "Significant Suppression of Leakage Current in $(Ba,Sr)TiO_3$ Thin Films by Ni or Mn Doping," J. Appl. Phys.,92(5): 2651-2654 (Sep. 2002).

Asghari, M. and Dawnay, E., "ASOC™—a manufacturing integrated optics technology," SPIE 3620: 252-262 (Jan. 1999).

Barbier, D. et al., "Amplifying four-wavelength combiner, based on erbium/ytterbium-doped waveguide amplifiers and integrated splitters," IEEE Photonics Tech. Lett. 9:315-317 (1997).

Barbier, D., "Performances and potential applications of erbium doped planar waveguide amplifiers and lasers," Proc. OAA, Victoria, BC, Canada, pp. 58-63 (Jul. 21-23, 1997).

Bates et al., "Thin-Film Lithium Batteries" in New Trends in Electrochemical Technology: Energy Storage Systems for Electronics (T. Osaka & M. Datta eds. Gordon and Breach 2000).

Beach R.J., "Theory and optimization of lens ducts," Applied Optics 35(12): 2005-2015 (1996).

Belkind, A. et al., "Pulsed-DC Reactive Sputtering of Dielectrics: Pulsing Parameter Effects," 43rd Annual Technical Conference Proceedings (2000).

Belkind, A. et al., "Using pulsed direct current power for reactive sputtering of $Al^2O_3$," J. Vac. Sci. Technol. A 17(4): 1934-1940 (1999).

Bestwick, T., "ASOC™ silicon integrated optics technology," SPIE 3631: 182-190 (1999).

Borsella, E. et al., "Structural incorporation of silver in soda-lime glass by the ion-exchange process: a photoluminescence spectroscopy study," Applied Physics A 71: 125-132 (2000).

Byer, R.L., "Nonlinear optics and solid-state lasers: 2000," IEEE J. Selected Topics in Quantum Electronics 6(6): 911-930 (2000).

(56) References Cited

OTHER PUBLICATIONS

Campbell, S.A. et al., "Titanium dioxide (TiO2)-based gate insulators," IBM J. Res. Develop. 43(3): 383-392 (1999).
Chang, C.Y. and Sze, S.M. (eds.), in ULSI Technology, The McGraw-Hill Companies, Inc., Nyew York, Chapter 4, pp. 169-170 and 226-231 (1996).
Chen, G. et al., "Development of supported bifunctional electrocatalysts for unitized regenerative fuel cells," J. Electrochemical Society 149(8): A1092-A1099 (2002).
Choi, Y.B. et al., "Er—Al-codoped silicate planar light waveguide-type amplifier fabricated by radio-frequency sputtering," Optics Letters 25(4): 263-265 (2000).
Choy et al., "Eu-Doped Y2O3 Phosphor Films Produced by Electrostatic-Assisted Chemical Vapor Deposition," J. Mater. Res. 14(7): 3111-3114 (Jul. 1999).
Cocorullo, G. et al., "Amorphous silicon waveguides and light modulators for integrated photonics realized by low-temperature plasma-enhanced chemical-vapor deposition," Optics Lett. 21(24): 2002-2004 (1996).
Cooksey, K. et al., "Predicting permeability & Transmission rate for multilayer materials," Food Technology 53(9): 60-63 (1999).
Crowder, M.A. et al., "Low-temperature single-crystal Si TFT's fabricated on Si films processed via sequential lateral solidification," IEEE Electron Device Lett. 19(8): 306-308 (1998).
Delavaux, J-M. et al., "Integrated optics erbium ytterbium amplifier system in 10Gb/s fiber transmission experiment," $22^{nd}$ European Conference on Optical Communication, Osla, I.123-I.126 (1996).
Distributed Energy Resources: Fuel Cells, Projects, 4 pages http://www.eere.energy.gov/der/fuel_cells/projects.html (2003).
Dorey, R.A., "Low temperature micromoulding of functional ceramic devices," Grant summary for GR/S84156/01 for the UK Engineering and Physical Sciences Research Council, 2 pages (2004).
DuPont Teijin Films, Mylar 200 SBL 300, Product Information, 4 pages (2000).
Electrometals Technologies Limited, Financial Report for 2002, Corporate Directory, Chairman's review, Review of Operations, 10 pages (2002).
E-Tek website: FAQ, Inside E-Tek, E-TEk News, Products; http://www.etek-inc.com/, 10 pages (2003).
Flytzanis, C. et al., "Nonlinear optics in composite materials," in Progress in Optics XXIX, Elsevier Science Publishers B.V., pp. 323-425 (1991).
Frazao, O. et al., "EDFA gain flattening using long-period fibre gratings based on the electric arc technique," Proc. London Comm. Symp. 2001, London, England, 3 pages (2001).
Fujii, M. et al., "1.54 μm photoluminescence of $Er^{3+}$ doped into $SiO_2$ films containing Si nanocrystals: evidence for energy transfer from Si nanocrystals for $Er^{3+}$," Appl. Phys. Lett. 71(9): 1198-1200 (1997).
Garcia, C. et al., "Size dependence of lifetime and absorption cross section of Si nanocrystals embedded in $SiO_2$," Appl. Phys. Left. 82(10): 1595-1597 (2003).
Goossens, A. et al., "Sensitization of $TiO_2$ with p-type semiconductor polymers," Chem. Phys. Lett. 287: 148 (1998).
Greene, J.E. et al., "Morphological and electrical properties of rf sputtered $Y_2O_3$-doped $ZrO_2$ thin films," J. Vac. Sci. Tech. 13(1): 72-75 (1976).
Han, H.-S. et al., "Optical gain at 1.54 μm in Erbium-doped Silicon nanocluster sensitized waveguide," Appl. Phys. Lett. 79(27): 4568-4570 (2001).
Hayakawa, T. et al., "Enhanced fluorescence from $Eu^{3+}$ owing to surface plasma oscillation of silver particles in glass," J. Non-Crystalline Solids 259: 16-22 (1999).
Hayakawa, T. et al., "Field enhancement effect of small Ag particles on the fluorescence from $Eu^{3+}$-doped $SiO_2$ glass," Appl. Phys. Lett. 74(11): 1513-1515 (1999).
Hayfield, P.C.S., I Development of a New Material-Monolithic $Ti_4O_7$ Ebonix® Ceramic, Royal Society of Chemistry, Cambridge, Table of Contents, 4 pages (2002).

Hehlen, M.P. et al., "Spectroscopic properties of $Er^{3+}$- and $Yb^{3+}$-doped soda-lime silicate and aluminosilicate glasses," Physical Review B 56(15): 9302-9318 (1997).
Hehlen, M.P. et al., "Uniform upconversion in high-concentration $Er^{3+}$-doped soda lime silicate and aluminosilicate glasses," Optics Letters 22(11); 772-774 (1997).
Horst, F. et al., "Compact, tunable optical devices in silicon-oxynitride waveguide technology," Top. Meeting Integrated Photonics Res. '00, Quebec, Canada, p. IThF1, 3 pages (2000).
Howson, R.P., "The reactive sputtering of oxides and nitrides," Pure & Appl. Chem. 66(6): 1311-1318 (1994).
Hubner, J. and Guldberg-Kjaer, S., "Planar Er- and Yb-doped amplifiers and lasers," COM Technical University of Denmark, $10^{th}$ European Conf. on Integrated Optics, Session WeB2, pp. 71-74 (2001).
Hwang et al., "Characterization of sputter-deposited LiMn2O4 thin films for rechargeable microbatteries," 141(12) J. Electrochem. Soc. 3296-99 (1994).
Hwang, M-S. et al., "The effect of pulsed magnetron sputtering on the properties of iridium tin oxide thin films," Surface and Coatings Tech. 171: 29-33 (2003).
Im, J.S. and Sposili, R.S., "Crystalline Si films for integrated active-matrix liquid crystal displays," MRS Bulletin, pp. 39-48 (1996).
Im, J.S. et al., "Controlled super-lateral growth of Si-films for microstructural manipulation and optimization," Physica Status Solidi (A) 166(2): 603-617 (1998).
Im, J.S. et al., "Single-crystal Si films for thin-film transistor devices," Appl. Physics Lett. 70(25): 3434-3436 (1997).
Itoh, M. et al., "Large reduction of singlemode-fibre coupling loss in 1.5% Δ planar lightwave circuits using spot-size converters," Electronics Letters 38(2): 72-74 (2002).
Jackson, M.K. and Movassaghi, M., "An accurate compact EFA model," Eur. Conf. Optical Comm., Munich, Germany, 2 pages (2000).
Janssen, R. et al., "Photoinduced electron transfer from conjugated polymers onto nanocrystalline $TiO_2$," Synthet. Metal., 1 page (1999).
Johnson, J.E. et al., "Monolithically integrated semiconductor optical amplifier and electroabsorption modulator with dual-waveguide spot-size converter input," IEEE J. Selected topics in Quantum Electronics 6(1): 19-25 (2000).
Jonsson, L.B. et al., "Frequency response in pulsed DC reactive sputtering processes," Thin Solid Films 365: 43-48 (2000).
Kato, K. and Inoue, Y., "Recent progress on PLC hybrid integration," SPIE 3631: 28-36 (1999).
Kato, K. and Tohmori, Y., "PLC hybrid integration technology and its application to photonic components," IEEE J. Selected Topics in Quantum Electronics 6(1): 4-13 (2000).
Kelly, P.J. and Arnell, R.D., "Control of the structure and properties of aluminum oxide coatings deposited by pulsed magnetron sputtering," J. Vac. Sci. Technol. A 17(3): 945-953 (1999).
Kelly, P.J. et al., "A novel technique for the deposition of aluminum-doped zinc oxide films," Thin Solid Films 426(1-2): 111-116 (2003).
Kelly, P.J. et al., "Reactive pulsed magnetron sputtering process for alumina films," J. Vac. Sci. Technol. A 18(6): 2890-2896 (2000).
Kik, P.G. and Polman, A., "Gain limiting processes in Er-doped Si nanocrystal waveguides in $SiO_2$," J. Appl. Phys. 91(1): 536-536 (2002).
Kim et al., "Correlation Between the Microstructures and the Cycling Performance of $RuO_2$ Electrodes for Thin-Film Microsupercapacitros," J. Vac. Sci. Technol. B20(5): 1827-1832 (Sep. 2002).
Kim, D-W. et al. "Mixture Behavior and Microwave Dielectric Properties in the Low-fired $TiO_2$—CuO System," Jpn. J. Appl. Phys. 39:2696-2700 (2000).
Kim, H-K. et al., "Characteristics of rapid-thermal-annealed LiCoO2 cathode film for an all-solid-state thin film microbattery," J. Vac. Sci. Technol. A 22(4): 1182-1187 (2004).
Kim, J-Y. et al. "Frequency-dependent pulsed direct current magnetron sputtering of titanium oxide films," J. Vac. Sci. Technol. A 19(2):429-434 (2001).
Ladouceur, F. and Love, J.D., in: Silica-based Buried Channel Waveguides and Devices, Chapman & Hall, London, Table of Contents, 6 pages (1996).

(56) References Cited

OTHER PUBLICATIONS

Ladouceur, F. et al., "Effect of side wall roughness in buried channel waveguides," IEEE Proc. Optoelectron. 141(4):242-248 (1994).

Lamb, W. and Zeiler, R., Designing Non-Foil Containing Skins for Vacuum Insulation Panel (VIP) Application, Vuoto XXVIII(1-2):55-58 (1999).

Lamb, W.B., "Designing Nonfoil Containing Skins for VIP Applications," DuPont VIA Symposium Presentation, 35 Pages (1999).

Lange, M.R. et al, "High Gain Ultra-Short Length Phosphate glass Erbium-Doped Fiber Amplifier Material," OSA Optical Fiber Communications (OFC), 3 Pages (2002).

Laporta, P. et al, "Diode-pumped cw bulk Er:Yb: glass laser," Optics Letters 16(24):1952-1954 (1991).

Laurent-Lund, C. et al., "PECVD Grown Mulitple Core Planar Wageguides with Extremely Low Interface Reflections and Losses," IEEE Photonics Tech. Lett. 10(10):1431-1433 (1998).

Lee, B.H. et al., "Effects of interfacial layer growth on the electrical characteristics of thin titanium oxide films on silion," Appl. Phys. Lett. 74(21):3143-3145 (1999).

Lee, K.K. et al., "Effect of size and roughness on light transmission in a $Si/SiO_2$ waveguide: Experiments and model," Appl. Phys. Lett. 77(11):1617-1619 (2000).

Love, J.D. et al., "Quantifying Loss Minimisation in Single-Mode Fibre Tapers," Electronics Letters 22(17):912-914 (1986).

Mardare, D. and Rusu, G.I., "On the structure of Titanium Oxide Thin Films," Andalele Stiintifice Ale Universitatii IASI, Romania, pp. 201-208 (1999).

Marques, P.V.S. et al., "Planar Silica-on-Silicon Waveguide Lasers Based in Two Layers Core Devices," $10^{th}$ European Conference on Integrated Optics, Session WeB2, pp. 79-82 (2001).

Meijerink, A. et al, "Luminescence of $Ag^+$ in Crystalline and Glassy $Srb_4O_7$," J. Physics Chem. Solids 54(8):901-906 (1993).

Mesnaoui, M. et al, "Spectroscopic properties of $Ag^+$ ions in phosphate glasses of $NaPO_3$- $AgPO_3$ system," Eur. J. Solid State Inorg. Chem. 29:1001-1013 (1992).

Mitomi, O. et al., "Design of a Single-Mode Tapered Waveguide for Low-Loss Chip-to-Fiber Coupling," IEEE J. Quantum Electronics 30(8): 1787-1793 (1994).

Mizuno, Y. et al "Temperature dependence of oxide decomposition on titanium surfaces in UHV," J. Vac. Sci & Tech. A. 20(5): 1716-1721 (2002).

Ohkubo, H. et al., Polarization-Insensitive Arrayed-Waveguide Grating Using Pure $SiO_2$ Cladding, Fifth Optoelectronics and Communication Conference (OECC 2000) Technical Digest, pp. 366-367 (2000).

Ohmi, S. et al., "Rare earth mental oxides for high-K fate insulator," VLSI Design 2004, 1 Page (2004).

Ohtsuki, T., et al., "Gain Characteristics of high concentration $Er^{3+}$-doped phosphate glass waveguide," J. Appl. Phys. 78(6):3617-3621 (1995).

Ono, H. et al., "Design of a Low-loss Y-branch Optical Waveguide," Fifth Optoelectronic and Communications Conference (OECC 2000) Technical Digest, pp. 502-503 (2000).

Padmini, P. et al. "Realization of High Tunability Barium Strontium Titanate Thin Films by rf Megnetron Sputtering," Appl. Phys. Lett. 75(20):3186-3188 (1999).

Pan, T. et al., "Planar $Er^{3+}$-doped aluminosilicate waveguide amplifier with more than 10 dB gain across C-band," Optical Society of America, 3 pages (2000).

Park et al., "Characteristics of Pt Thin Film on the Conducting Ceramics TiO and Ebonex ($Ti_4O_7$) as Electrode Materials," Thin Solid Films 258: 5-9 (1995).

Peters, D.P. et al., "Formation mechanism of silver nanocrystals made by ion irradiation of $Na^+$—$Ag^+$ ion-exchanged sodalime silicate glass," Nuclear Instruments and Methods in Physics Research B 168:237-244 (2000).

Rajarajan, M. et al., "Numerical Study of Spot-Size Expanders fro an Efficient OEIC to SMF Coupling," IEEE Photonics Technology Letters 10(8): 1082-1084 (1998).

Ramaswamy, R.V. et al., "Ion-Exchange Glass Waveguides: A Review," J. Lightwave Technology 6(6): 984-1002 (1988).

Roberts, S.W. et al., "The Photoluminescence of Erbium-doped Silicon Monoxide," University of Southampton , Department of Electronics and Computer Science Research Journal, 7 pages (1996).

Saha et al., "Large Reduction of Leakage Current by Graded-Layer La Doping in (Ba0.5,Sr0.5)TiO3 Thin Films," Appl. Phys. Lett. 79(1): 111-113 (Jul. 2001).

Sanyo Vacuum Industries Co., Ltd. Products Infor, $TiO_2$, (2003), 1 page, http://www.sanyovac.co.jp/Englishweb/products?ETiO2.htm.

Schermer, R. et al., "Investigation of Mesa Dielectric Waveguides," Proceedings of the OSA Integrated Photonics Research Topical Meeting and Exhibit, Paper No. IWB3, 3 pages (2001).

Schiller, S. et al., "PVD Coating of Plastic Webs and Sheets with High Rates on Large Areas," European Materials Research Society 1999 Spring Meeting, Jun. 1-4, 1999, Strasbourg, France, 13 pages (1999).

Scholl, R., "Power Supplies for Pulsed Plasma Technologies: State-of-the-Art and Outlook," Advances Energy Industries, Inc. 1-8 (1999).

Scholl, R., "Power Systems for Reactive Sputtering of Insulating Films," Advances Energy Industries, Inc., 1-8 (Aug. 2001).

Second International Symposium of Polymer Surface Modification: Relevance to Adhesion, Preliminary Program, 13 pages (1999).

Seventh International Conference on $TiO_2$ Photocatalysis: Fundamentals & Applications, Toronto, Ontario, Canada, Final Program, 7 pages (Nov. 17-21, 2002).

Sewell, P. et al., "Rib Waveguide Spot-Size Transformers: Modal Properties," J Lightwave Technology 17(5):848-856 (1999).

Shaw, D.G. et al., "Use of Vapor Deposited Acrylate Coatings to Improve the Barrier Properties of Metallized Film," Society of Vacuum Coaters, $37^{th}$ Annual Technical Conference Proceedings, pp. 240-244 (1994).

Shin, J.C. et al. "Dielectric and Electrical Properties of Sputter Grown $(Ba,Se)TiO_3$ Thin Films," J. Appl. Phys. 86(1):506-513 (1999).

Shmulovich, J. et al., "Recent progress in Erbium-doped waveguide amplifiers," Bell Laboratories, pp. 35-37 (1999).

Slooff, L.H. et al., "Optical properties of Erbium-doped organic polydentate cage complexes," J. Appl. Phys. 83(1):497-503 (1998).

Smith, R.E. et al., "Reduced Coupling Loss Using a Tapered-Rib Adiabatic-Following Fiber Coupler," IEEE Photonics Technology Lett. 8(8):1052-1054 (1996).

Snoeks, E. et al., "Cooperative upconversion in erbium-implanted soda-lime silicate glass optical waveguides," J. Opt. Soc. Am. B 12(8): 1468-1474 (1995).

Strohhofer, C. and Polman, A. "Energy transfer to $Er^{3+}$ in Ag ion-exchanged glass," FOM Institute for Atomic and Molecular Physics, 10 pages (2001).

Sugiyama, A. et al., "Gas Permeation Through the Pinholes of Plastic Film Laminated with Aluminum Foil," Vuoto XXVIII(1-2):51-54 (1999).

Tervonen, A. "Challenges and opportunities for integrated optics in optical networks," SPIE 3620:2-11 (1999).

Ting, C.Y. et al., "Study of planarized sputter-deposited $SiO_2$," J. Vac. Sci Technol, 15(3):1105-1112 (1978).

Tomaszewski, H. et al., "Yttria-stabilized zirconia thin films grown by reactive r.f. magnetron sputtering," Thin Solid Films 287: 104-109 (1996).

Triechel, O. and Kirchhoff, V., "The influences of pulsed magnetron sputtering on topography and crystallinity of $TiO_2$ films on glass," Surface and Coating Technology 123:268-272 (2000).

Tukamoto, H. and West, A.R., "Electronic Conductivity of $LiCoO_s$ and Its Enhancement by Magnesium Doping," J. Electrochem. Soc 144(9):3164-3168 (1997).

Van Dover, R.B., "Amorphous Lanthanide-Doped $TiO_x$ Dielectric Films," Appl. Phys. Lett. 74(20):3041-3043 (1999).

Viljanen, J. and Leppihalme, M., "Planner Optical Coupling Elements for Multimode Fibers with Two-Step Ion Migration Process," Applied Physics 24(1):61-63 (1981).

Villegas, M.A. et al., "Optical spectroscopy of a soda lime glass exchanged with silver," Phys. Chem. Glasses 37(6):248-253 (1996).

(56) References Cited

OTHER PUBLICATIONS

Von Rottkay, K. et al., "Influences of stoichiometry on electrochromic cerium-titanium oxide compounds," Presented at the 11$^{th}$ Int'l Conference of Solid State Ionics, Honolulu, Hawaii, Nov. 19, 1997, Published in Solid State Ionics 113-115:425-430. (1998).

Wang, B. et al., "Characterization of Thin-Film Rechargeable Lithium Batteries with Lithium Cobalt Oxide Cathodes," J. Electrochem. Soc. 143:3203-13 (1996).

Westlinder, J. et al., "Simulations and Dielectric Characterization of Reactive dc Magnetron Cosputtered $(Ta_2O_5)_{1-x}(TiO_2)_x$ Thin Films," J Vac. Sci. Technol. B 20(3):855-861 (May/Jun. 2002).

Wilkes, K.E., "Gas Permeation Through Vacuum Barrier Films and its Effect on VIP Thermal Performance," presented at the Vacuum Insulation Panel Symp., Baltimore, Maryland, 21 pages (May 3, 1999).

Yanagawa, H. et al., "Index-and-Dimensional Taper and Its Application to Photonic Devices," J. Lightwave Technology 10(5):587-591 (1992).

Yoshikawa, K. et al., "Spray formed aluminum alloys for sputtering targets," Powder Metallurgy 43(3): 198-199 (2000).

Zhang, H. et al., "High Dielectric Strength, High k $TiO_2$ Films by Pulsed DC, Reactive Sputter Deposition," 5 pages (2001).

Jones and Akridge, "A thin film solid state microbattery," Solid State Ionics 53-56 (1992), pp. 628-634.

PCT Chapter I International Preliminary Report On Patentability (IPRP Chapter I) PCT/US2008/087569 mailed Jun. 22, 2010. (7 Pages).

PCT International Search Report And Written Opinion for PCT International Appln No. PCT/US 08/87569 mailed Mar. 3, 2009. (7 pages).

\* cited by examiner

METHOD FOR SPUTTER TARGETS FOR ELECTROLYTE FILMS

RELATED APPLICATIONS

This application is related to and claims the benefit under 35 U.S.C. §119 of U.S. provisional application Ser. No. 61/016,038, entitled "METHOD FOR SPUTTER TARGETS FOR ELECTROLYTE FILMS," filed Dec. 21, 2007, which is incorporated herein by reference in its entirety.

FIELD OF THE INVENTION

The present invention is related to the fabrication of lithium-ion thin-film electrolytes for use in thin-film electrochemical energy storage and conversion devices.

BACKGROUND OF THE INVENTION

Presently, lithium-ion electrolyte layers are deposited from ceramic, insulating sputter targets using radio-frequency (RF) excitation (1 MHz-1 GHz) on the sputter target together with a RF tuner and a RF matching network. The main reason for this approach lies in the fact that the ceramic target composition or stoichiometry can be fabricated identical, or at least most similar, to the stochiometry of the lithium-ion electrolyte layer to be deposited. However, both the use of the ceramic insulating sputter target and the RF sputter method may be undesirable due to their associated high costs, limitations in deposition area and rate, and hardware sophistication and challenges.

The electrically insulating type target typically requires the use of RF excitation when sputtering. Otherwise, when not using RF excitation, such as direct current (DC), pulsed DC (e.g. 250 kHz), or alternate current with a lower frequency (AC; e.g. 100 kHz) excitation, the target surface charges up substantially and releases the built-up charges in form of an electric arc to the substrate, the chamber wall, and/or the dark space shield. Electric arcing could be either so severe that electronics in the power supply connected to the sputter target may not prevent this event from occurring, which detrimentally affects the film growth on the substrate, or the sputter process could be interrupted too frequently by the preventive electronics of the power supply that a sputter deposition may not take place. Unfortunately, the entire RF electronics around a sputter target are fairly expensive as well as require the vacuum deposition chamber to be RF compatible. Most large sputter deposition tools used in semi-conductor manufacturing are not RF compatible but are only direct current (DC) or pulse DC compatible. The design and build of new, large vacuum deposition chambers takes substantial amounts of time and money because these chambers are not anticipated to be built and sold in large numbers.

Another issue in RF sputtering is that, for deposition of oxide dielectric films, ceramic targets are typically formed of multiple smaller tiles due to limitations in fabricating large area ceramic sputter targets in thicknesses (e.g. ¼ inch) that are appropriate for use in sputter processes. Further, the reactors required for RF sputtering tend to be rather complicated. In particular, the engineering of low capacitance efficient RF power distribution to the sputter cathode is difficult in RF systems. Routing of low capacitance forward and return power into a vacuum vessel of the reaction chamber often exposes the power path in such a way that diffuse plasma discharge is allowed under some conditions of impedance tuning of the matching networks.

Typically, it has been difficult to fabricate large area, insulating, ceramic sputter targets because their constituent tile size, singly-tiled or multi-tiled, is limited by today's available ceramic processing methods (cold pressing plus subsequent sintering or, instead, hot pressing of appropriate starting powders) in light of the performance requirements for ceramic sputter target tiles when sputtered under the thermal stresses of high rate sputter deposition. However, owing to the inherent brittleness of ceramic tiles and their limited, practical thickness when to be used in magnetron sputter targets (typical thickness is about ½ to ¼ inch for practical usage purposes) wherein the magnetic field of the magnetron has to go well through the sputter target tile thickness, tile manufacturers face the challenging task of making the target tiles as large as possible while being limited in its thickness. Thus, target manufacturers have encountered a loosely defined limit for the area/thickness ratio for every target tile material above which the target tile fabrication yield becomes too low to be economically viable. For practical and well performing $Li_3PO_4$ sputter target tiles, the tile size limit today for ¼ inch thick targets is on the order of 10" in diameter or 7"×7" for non-disc shapes.

In addition to the difficult or even impossible fabrication of large area, insulating, ceramic sputter targets that prove to be mechanically sufficiently resilient in high-rate sputter depositions, issues such as local charging/arcing, cross talk with other areas, and severe and variable impedance mismatch between the power supply and deposition environment conspire to limit the nominal practical sputter target area to be below about 1000 $cm^2$ for well established ceramic sputter materials such as $Al_2O_3$ and about 500 $cm^2$ for less established ceramic materials, such as $Li_3PO_4$.

In light of the issues involved in ceramic tile fabrication and the associated use of RF target excitation, it is desirable to switch from ceramic to metallic target tiles, if possible with respect to the necessary reactive sputter deposition in the case of metallic tiles, because metallic plates of about ¼ inch in thickness can more easily be fabricated in large areas. Another inherent benefit of using metallic targets over ceramic targets is based on the fact that the far more ductile metallic targets can be sputtered at much higher deposition powers and deposition rates, which creates a stressful temperature gradient inside a sputter target tile with which metallic target tiles can cope much more readily compared to brittle ceramic tiles.

The economics of mass-producing lithium-ion thin film electrochemical storage and conversion devices strongly depend on the capital expenditures for a given production throughput, which in turn is affected by the deposition rate, deposition area, deposition yield, and equipment up-time. In this regard, the issues of having to use relatively small, brittle ceramic sputter targets or target tiles in conjunction with RF sputter target excitation represents a significant economic barrier in scaling the production processes of lithium-ion thin film electrochemical storage and conversion devices to industrial levels.

To avoid the cost and tool issues involved in RF sputtering one may seek to sputter deposit said electrolyte or dielectric layers from electrically conducting sputter targets using DC or pulsed DC target excitation power. In that case, the charge-up and electric arcing issues are fewer and typically manageable. Both of these DC sputter methods are less expensive than RF and simpler to implement in vacuum deposition systems. However, in order to attain an electrically insulating but ionically (here: lithium-ion) conducting electrolyte or dielectric layer from an electrically conducting sputter target, one has to sputter deposit the target material in a reactive atmosphere to achieve the electrically insulating film composition of the correct stoichiometry. In some cases one may opt to attain the correct film stoichiometry via co-sputtering from a suitable, second sputter target, which, if electrically insulating, would require RF power excitation whereas if electrically conducting, could be sputtered by DC or pulsed DC excitation as well.

There is not a substantial track record in the field of creating sputter deposition targets that are amenable to DC or pulse DC deposition while producing insulating/dielectric, lithium containing films with electrolytic properties when deposited. Nor is there a significant amount of published work on the subject of using alternative sputter target compositions or configurations specifically to allow for DC deposition of sputtered materials that turn into electrolytes by becoming electrically insulating and ionically conducting when deposited as well. This scarcity of published information or patents extends to not only lithium-ion but all electrolytes. Most of the published work in this area focuses on how to increase the target area or how to improve the hardware. Whereas, the motivation of the present invention is to fabricate a conductive target composition that allows the use of DC or pulsed DC target sputter power to accomplish a lithium-ion electrolyte thin film cheaper and faster.

U.S. Patent application No. 2006/0054496 discloses oxide and oxynitride films being presented and deposited by a DC sputter method from a metallic target material. This disclosure focuses, however, on the sputter hardware and does not, for example, address the problem of modifying the composition/structure of the target to facilitate DC powered deposition of sputter materials whose physical vapor deposited films turn into thin-film electrolytes.

U.S. Pat. No. 5,753,385 (the "'385 patent") uses metallic sputter targets of zirconium and yttrium to form oxides that are used as high-temperature, oxygen-ion conducting membranes in solid oxide fuel cells. Although these membranes have electrolytic properties, they are only high-temperature electrolytic properties and are exclusively relative to oxygen ions. The present invention, in contrast, focuses, for example, on ambient-temperature lithium-ion electrolytes. The underlying chemistry and physical parameters to form oxygen-ion electrolytes and lithium-ion electrolytes are very different. For example, a high-temperature oxygen-ion electrolyte needs to be crystalline while a lithium-ion electrolyte of the present invention only needs to be glassy or amorphous. In fact, if the lithium-ion electrolyte of the present invention is or becomes crystalline during its fabrication or thereafter at any time during its lifetime, it will severely limit the associated lithium thin-film electrochemical storage and conversion device to the use of only non-metallic lithium-ion anodes because a metallic lithium anode may short-circuit a lithium thin-film electrochemical storage and conversion device by creating an electrochemical short-circuit pathway from the anode to the cathode via grain boundary diffusion inside the crystalline electrolyte. If no (glassy or amorphous lithium-ion electrolyte) or virtually no (nano-crystalline lithium-ion electrolyte) grain boundaries exist, the inadvertent and undesirable formation of an electrochemical short-circuit pathway may not occur. The reason why the '385 patent can afford the use of a (high-temperature oxygen-ion) crystalline electrolyte lies mostly in the fact that the fuel cell device does not possess a creeping, easily diffusing, short-circuit creating, metallic lithium anode. Due to the vast difference of the motivation as well as benefits between the current invention and the '385 patent, one of ordinary skill in the art would not come up, for example, with a way to fabricate a lithium-ion thin-film electrolyte by non-RF sputter deposition techniques based on the '385 patent.

U.S. Pat. No. 7,179,350 B2 discloses a hybrid approach optimized for reactive sputtering, whereby the magnetron head is driven by both DC and RF controllers at the same time. Its focus, however, is on sputter hardware modification and not on target composition to achieve a lithium electrolyte film.

While battery and fuel cell thin film electrolytes have been radio-frequency (RF) sputter deposited for more than one decade, the instrumentation used for these growths has been relatively small: research and development or pilot line systems only. As this technology is scaled to the necessary (profitable) full industrial level, there is a need for more economical equipment and less costly consumables. Accordingly, the ability to sputter deposit electrolyte and dielectric layers over very large areas more quickly, and with less expense by using larger metallic targets and less expensive DC type sputter target excitation is very appealing, and the proper solution should result in significant savings of both time and money during high volume production.

SUMMARY OF THE INVENTION

Various aspects and embodiments of the present invention, as described in more detail and by example below, address certain of the shortfalls of the background technology and emerging needs in the relevant industries. Accordingly, the present invention is directed, for example, to a sputter target and a method of forming a sputter target that substantially obviate one or more of the shortcomings or problems due to the limitations and disadvantages of the related art.

The use herein of the terms "electrically conductive" and "electrically insulating" when describing material shall be interchangeable with the terms "electronically conductive" and "electronically insulating," respectively. The use of each of these terms when describing a material is neither exclusive nor inclusive of whether that material does or does not also conduct ions.

Thin film electrochemical storage and conversion devices include electrically insulating but ionically conducting layers, so-called electrolyte or dielectric layers. When sputter depositing these layers, either electrically insulating or conducting sputter targets may be used. The thin-film electrochemical storage and conversion devices of the present invention employ a lithium-ion electrolyte layer (one type of ionically conducting layer) which primarily conducts lithium ions.

One aspect of an embodiment of the invention involves the sputter deposition of electrically insulating but lithium-ion conducting films (conductive ceramic films) using the less expensive DC or pulsed DC method, both of which can be implemented in any vacuum deposition tool/chamber more simply and reliably compared to the more sophisticated and more expensive RF method. This DC or pulsed DC approach uses the electrically conducting sputter targets and converts their composition into the correct film stoichiometry by reactive sputter deposition.

Another aspect of an embodiment of the invention pertains to overcoming the practical limitation of the sputter target size, both in surface area and thickness, and/or sputter tile size within a multi-tiled sputter target that can be used to deposit the required electrically insulating, lithium-ion conducting electrolyte or dielectric layers.

A further aspect of an embodiment of the invention involves the generally higher thermal conductivity of metallic targets compared to their ceramic counterparts. This allows for the use of thicker metallic sputter targets, because for a given sputter target thickness the target cooling from the cooled target backing plate through the entire bulk of the sputter target is more efficient for metallic targets while additionally their thermal gradients are typically much smaller. Associated with the beneficial option of using thicker metallic targets is a less frequent maintenance schedule, reduced down-time of the production equipment, and thus lower fabrication costs of the thin film electrochemical storage and conversion devices because thicker sputter targets can be operated for longer periods before they have to be replaced. A compromise between target thickness and magnetron action at the sputter target surface may need to be made in order to optimize the performance of the production sputter equipment.

BRIEF DESCRIPTION OF THE DRAWINGS

Some features and advantages of the invention are described with reference to the drawings of certain preferred embodiments, which are intended to illustrate and not to limit the invention.

The accompanying drawings, which are included to provide a further understanding of the invention and are incorporated in and constitute a part of this specification, illustrate exemplary embodiments of the invention that together with the description serve to explain the principles of the invention. In the drawings.

DETAILED DESCRIPTION OF THE PREFERRED EMBODIMENTS

These and other aspects of the invention will now be described in greater detail in connection with exemplary embodiments that are illustrated in the accompanying drawings.

It is to be understood that the present invention is not limited to the particular methodology, compounds, materials, manufacturing techniques, uses, and applications described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. Unless the context of the disclosure or claims dictate otherwise, for example, the terms "target" and "target title" may be used interchangeably.

All patents and other publications identified are incorporated herein by reference for the purpose of describing and disclosing, for example, the methodologies described in such publications that might be used in connection with the present invention. These publications are provided solely for their disclosure prior to the filing date of the present application. Nothing in this regard should be construed as an admission that the inventors are not entitled to antedate such disclosure by virtue of prior invention or for any other reason.

Figure 1:
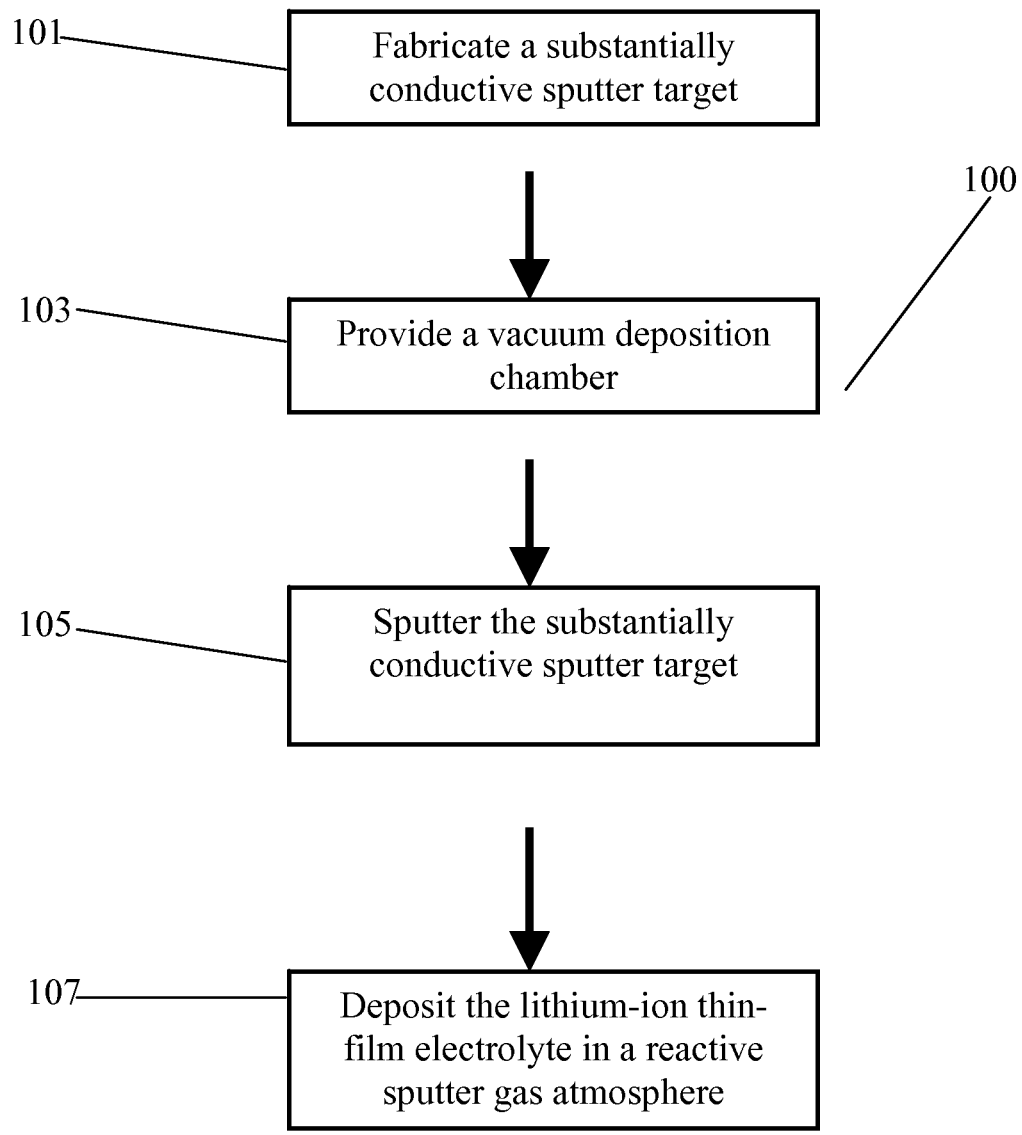
FIG. 1 illustrates a sequence of processing steps that can be used to fabricate lithium-ion thin-film electrolytes for use in thin-film electrochemical energy storage and conversion devices according to an embodiment of the present invention.

FIG. 1 illustrates an embodiment of an exemplary process 100 for fabricating lithium-ion thin-film electrolytes for use in thin-film electrochemical energy storage and conversion devices according to some embodiments of the present invention. Process 100 includes fabricating, for example, a mechanically robust and substantially conductive sputter target, step 101, providing a vacuum deposition chamber, step 103, sputtering the mechanically robust and substantially conductive sputter target, step 105, and depositing the lithium-ion thin-film electrolyte in a reactive sputter gas atmosphere, step 107.

In step 101, according to embodiments of the present invention, the sputter target is made from electrically conductive or at least semi-conductive, target materials with a conductivity of greater than about $10^{-4}$ S/cm at room temperature. For the present invention, the conductivity is preferably at least $10^{-8}$ S/cm at room temperature and most preferably 1 S/cm at room temperature. By using appropriate materials for the sputter target and operating it in a reactive gas environment, an electrically insulating but lithium-ion conducting film may be deposited. This effect relies on using a reactive sputter gas environment whereby the ejected target materials react with each other and with some subset of the neutral and/or ionized constituents of the sputter plasma to form a new chemical compound on the substrate. In step 107, deposition in a reactive sputter gas atmosphere can convert the material sputtered from a lithium-ion conducting sputter target into an electrically insulating and lithium-ion conducting electrolyte film. In step 107, possible gas constituents include oxygen, nitrogen, fluorine, chlorine, bromine, iodine, sulfur, selenium, tellurium, phosphorus, arsenic, antimony, bismuth, lead, carbon, hydrogen, silicon, lithium, sodium, magnesium, and zirconium that are introduced into the sputter reactor in gaseous form, either as chemical elements or chemical compounds. Possible target constituents include lithium, phosphorus, oxygen, nitrogen, fluorine, chlorine, bromine, iodine, sulfur, selenium, tellurium, arsenic, antimony, bismuth, lead, carbon, hydrogen, silicon, sodium, magnesium, and zirconium, as well as the materials from the group of lithium phosphate ($Li_3PO_4$), nitrided lithium phosphate, lithium phosphide and sub-phosphide ($Li_xP$ for $1 \leq x \leq 100$), lithium nitride and sub-nitride ($Li_xN$ for $3 \leq x \leq 100$), phosphorus oxide and sub-oxide ($PO_x$ for $x \leq 2.5$), phosphorus nitride and sub-nitride ($PN_x$ for $x \leq 1.7$), and lithium oxide and sub-oxide ($Li_xO$ for $1 \leq x \leq 100$). The material systems are also selected such that any insulting film that might form on the surface of the target as a result of reaction with the sputter gas does not substantially impede subsequent deposition. The reactions leading to the conversion of the sputtered constituents and gas constituents into the electrolyte film occur on the surface of the film as it is being deposited.

By making the target electrically conducting, the type of target excitation is no longer limited to RF power. Therefore, in step 103, the vacuum deposition chamber provided does not have to be RF compatible, which otherwise is difficult for large manufacturing tools. Similarly, the sputtering process in step 105 can be done with cheaper DC or pulsed DC power electronics at higher rates compared to RF. In addition, the depositing process in step 107 can be finished faster and cheaper compared with previous RF methods.

According to the embodiments of the present invention, steps 103, 105, and 107 may be performed with any combination of RF (ranging from 1 MHz to 1 GHz), AC, pulsed DC, and DC power (alone or together in various combinations) to produce the films of interest. It is also possible that, in step 107, more than one film constituent is deposited in sequence using a non-sputter technique such as thermal evaporation, chemical vapor deposition, or cathodic arc deposition. This non-sputtered constituent may be deposited from an electrically insulating or conducting source. The latter source material most preferably includes the deposition be performed in a reactive atmosphere with regard to the chemical reactivity of the source material.

In accordance with the embodiments of the present invention, the sputter target in step 101 may be made of a single compound, a multi-constituent composite, or a collection of target tiles within the confines of the target with significantly different compositions. In all cases, individual tile segments are preferably larger than 300 $cm^2$. If more than one different kind of target is needed to create the desired film, one may use a substrate translation in conjunction with optional target switching and/or deposition from multiple sputter cathodes whose sputtered species are simultaneously directed towards the growing film on the substrate. An added benefit of this invention is that the electrically conductive target will necessarily be more thermally conductive than a typical electrically insulating target. This increase in thermal conductivity will allow for the implementation of thicker targets (up to 5 cm) compared with thinner ones before (0.6 cm), thereby reducing the frequency of target replacement (reduces overall cost of fabrication).

The following examples are included to provide further understanding of the invention and are incorporated in and constitute a part of this specification, illustrate exemplary embodiments of the invention.

Figure 2:
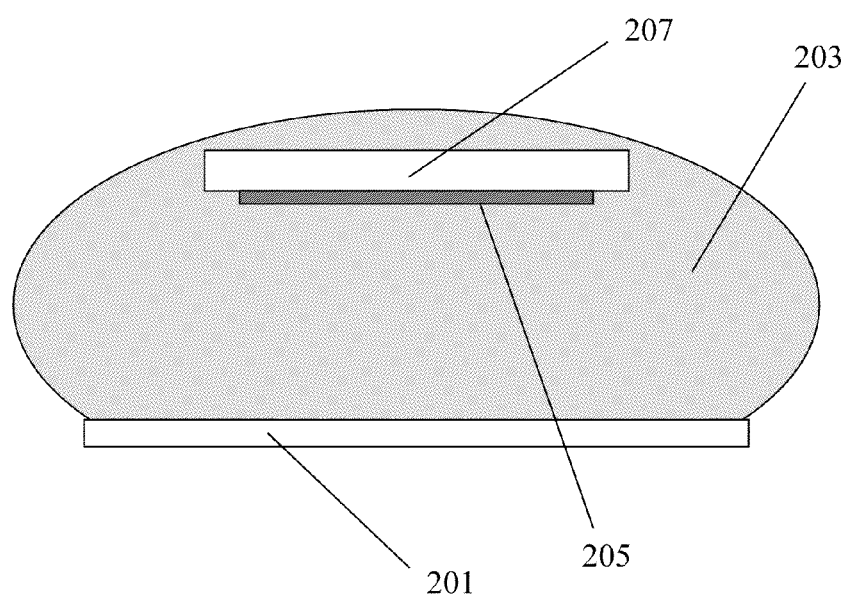
FIG. 2 illustrates an embodiment of the sputter deposition of an electrolyte film from a $Li_3P$ sputter target in an $O_2/N_2$ reactive plasma sputter plume in which the substrate is immersed, thus causing the deposition of the electrolyte film onto the substrate.

Example 1 (FIG. 2) provides an exemplary embodiment of process 100 in which a LIPON electrolyte film of composition $Li_{2.9}PO_{3.3}N_{0.46}$ 205 may be deposited onto a substrate 207 by DC, pulsed DC, AC, or RF reactive sputtering from semi-conducting target of the composition $Li_3P$ 201 when immersed in a sputter plasma plume 203 including the sputtered material and a reactive gas mixture of oxygen and nitrogen, with or without addition of inert gas such as argon. The $O_2/N_2$ ratio is to be adapted to less than 1/100 due to the much higher affinity of the depositing Li and P species to bond with oxygen compared to nitrogen. For a given oxygen/nitrogen ratio (for example, 1/1000) inside the vacuum deposition reactor both kinetic and thermodynamic factors determine the final stoichiometric parameters x, y, and z in the growing $Li_xPO_yN_z$ film. Among the kinetic parameters are the target sputter power (for example, 2000 W for 10 inch in diameter $Li_3P$ target), the pulsed duty cycle (for example, periods of 2 μs power on and 2 μs power off), the target-to-substrate distance (for example, 7.5 cm), the deposition rate (for example, 3 μm/h), the substrate temperature (for example, 150° C.), the substrate bias (for example, −70V), the nitrogen flow rate (for example, 300 sccm), and the oxygen flow rate (for example, 0.3 sccm, as may be indirectly established through the $N_2$ gas supply that contains 0.1 vol % $O_2$). In concert with the kinetic parameters, thermodynamic factors such as the substrate temperature (among other factors, is a function of the sputter target power) and the oxygen/nitrogen ratio at the growing film surface play a role in the stoichiometry of the growing LIPON film.

Figure 3:
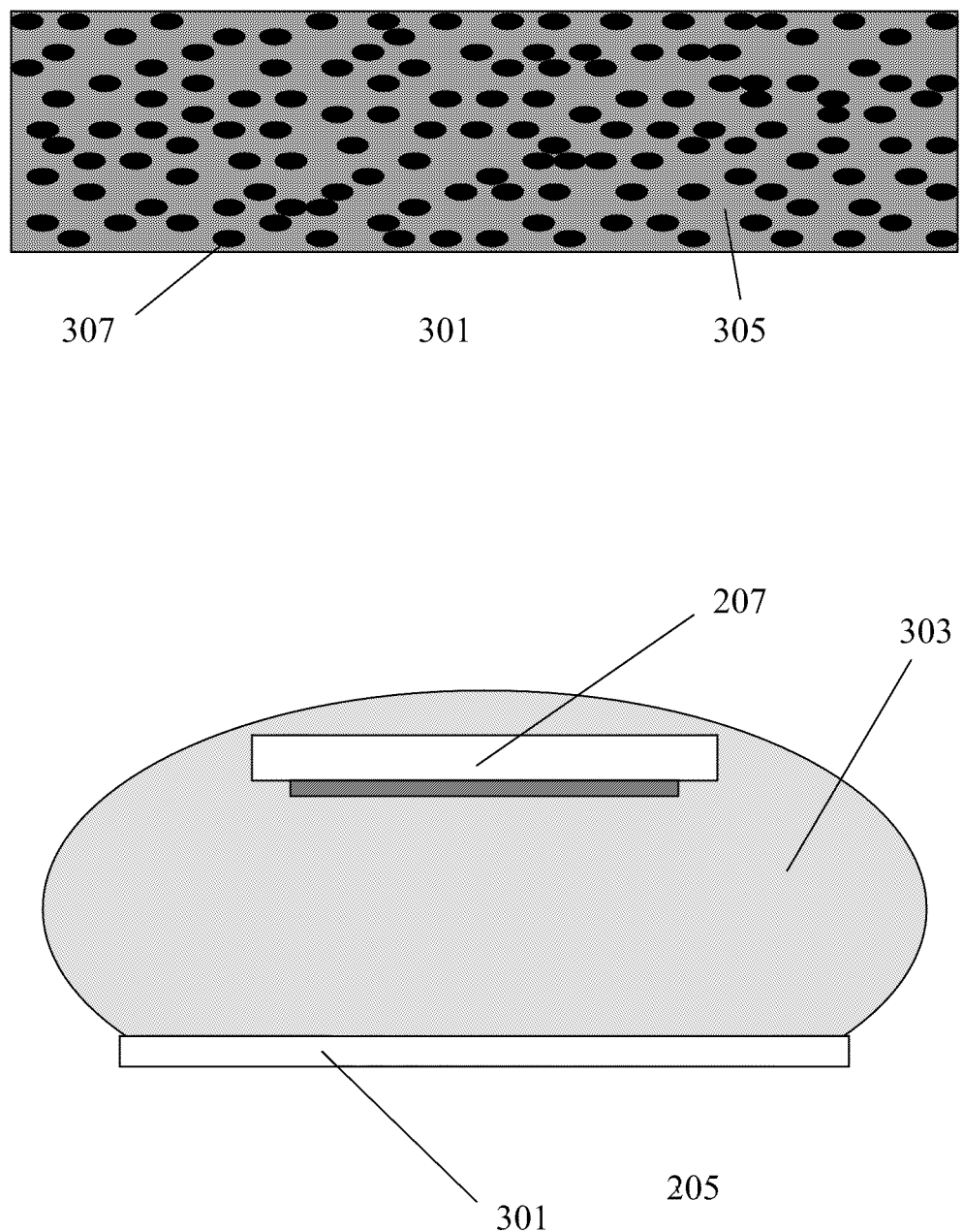
FIG. 3 illustrates an embodiment of the sputter deposition of an electrolyte film from a composited sputter target consisting of a $Li_xP$ phase and a $Li_2O$ phase.

Example 2 (FIG. 3) provides an exemplary embodiment of process 100 in which a LIPON electrolyte film of $Li_{2.9}PO_{3.3}N_{0.46}$ 205 may be deposited by DC, pulsed DC, AC, or RF reactive sputtering from a composite target 301 composed of lithium rich $Li_xP$ (x>>3) 305 and $Li_2O$, 307 either composited on a microscopic level or on a centimeter scale by alternatingly placing $Li_xP$ tiles and $Li_2O$ tiles substantially close to each other so that when sputtering such target in a reactive, at least nitrogen containing sputter plasma plume 303, with or without addition of inert gas such as argon, the concentration ratio of Li/P yields about 2.9, the O/P ratio yields about 3.3, while the N/P ratio amounts to about 0.46. The microscopic composition of $Li_xP$ (x>>3) 305 and $Li_2O$ 307 may be preferred over the centimeter scale composite, because it provides a semi-conducting surface of the sputter target 301 that is useful for operating the target under DC or pulse sputter conditions.

Figure 4:
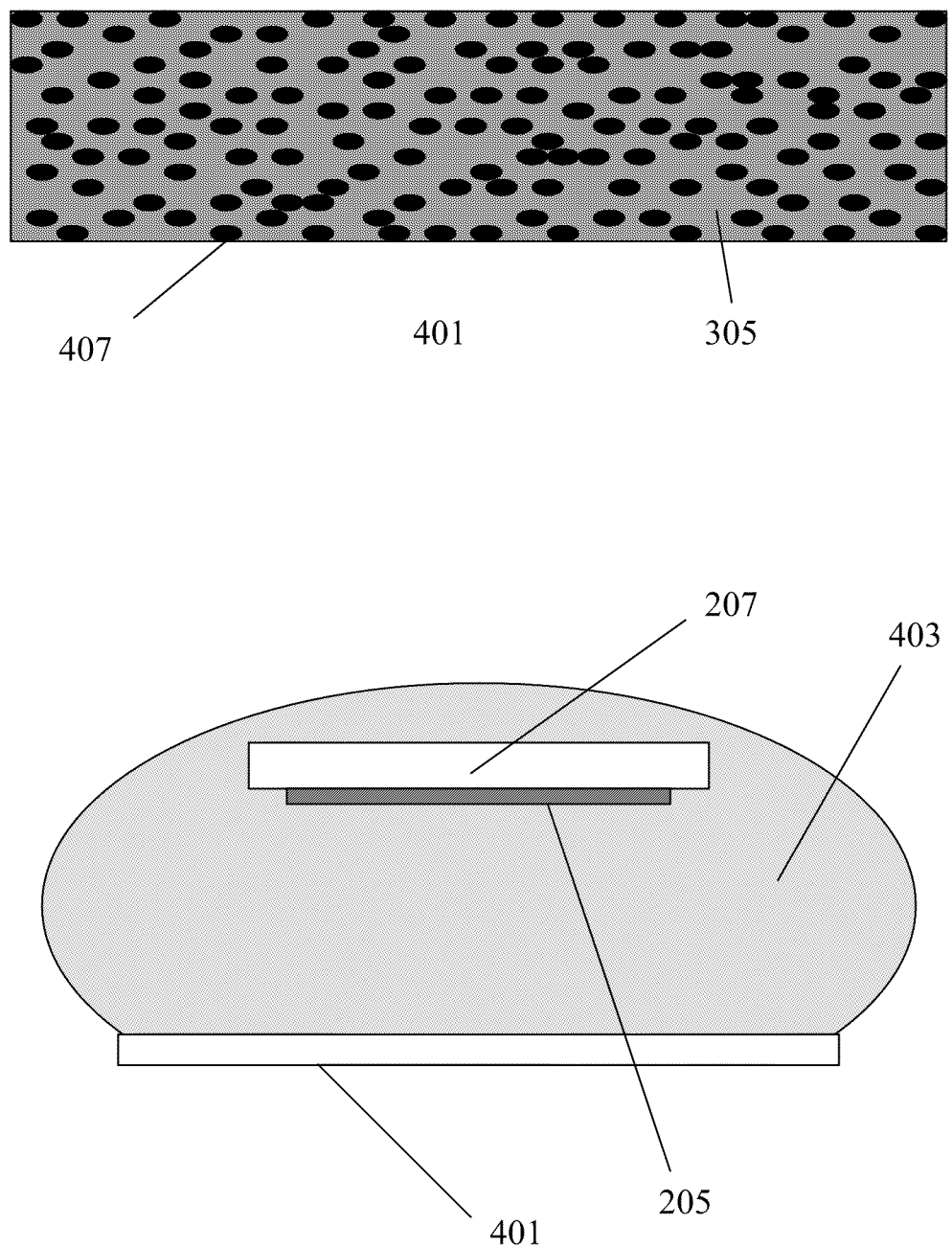
FIG. 4 illustrates an embodiment of the sputter deposition from FIG. 3 when the $Li_2O$ is replaced by $Li_3N$.

Example 3 (FIG. 4) provides an exemplary embodiment of process 100 in which the sputter target 401 comprises $Li_3N$ 407 instead of $Li_2O$ 307 as illustrated by Example 2 and the so-fabricated sputter target 401 is DC, pulsed DC, AC, or RF sputtered in a plasma plume 403 containing at least nitrogen and oxygen.

Example 4 provides an exemplary embodiment of process 100 in which the sputter target comprises $P_2O_5$ instead of $Li_xP$ (x>>3) as provided by Example 3 (FIG. 4) and the so-fabricated sputter target is DC, pulsed DC, AC, or RF sputtered in an atmosphere containing at least nitrogen.

Example 5 provides an exemplary embodiment of process 100 in which the sputter target comprises PN instead of $P_2O_5$ as provided by Example 4 and the so-fabricated sputter target is DC, pulsed DC, AC, or RF sputtered in an atmosphere containing at least nitrogen and oxygen.

Example 6 provides an exemplary embodiment of process 100 in which the sputter target is fabricated from a microscopic composite of metallic lithium and PN and the so-fabricated sputter target is DC, pulsed DC, AC, or RF sputtered in an atmosphere containing at least nitrogen and oxygen.

Figure 5:
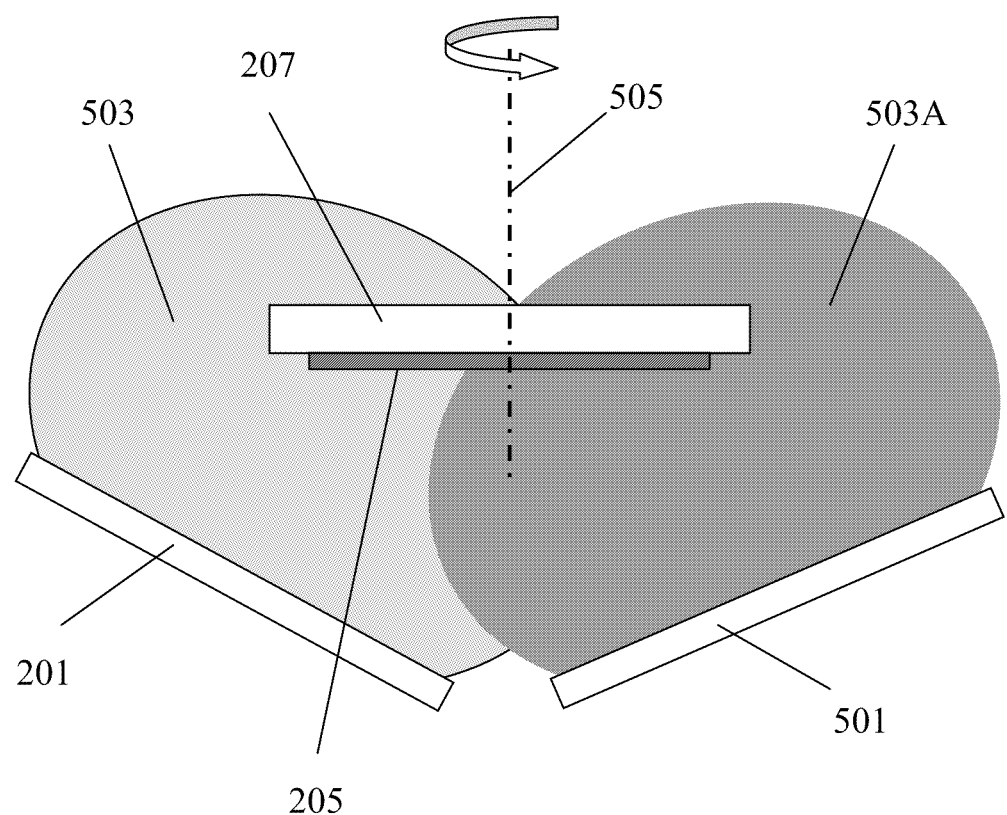
FIG. 5 illustrates an embodiment of the sputter deposition of an electrolyte film onto a substrate, which is immersed in two plasmas formed from two different sputter targets.

Example 7 (FIG. 5) provides an exemplary embodiment of process 100 in which a LIPON electrolyte film of composition $Li_{2.9}PO_{3.3}N_{0.46}$ 205 may be deposited by DC, pulsed DC, AC, or RF reactive sputtering from at least two separated sputter targets 201 and 501 whose sputter plasma plumes 503 and 503A are both directed towards the substrate 207 where the $Li_{2.9}PO_{3.3}N_{0.46}$ electrolyte film 205 is grown. The first sputter target 201 may be fabricated as provided by Example 1 (FIG. 2) while the second sputter target 501 may be fabricated as provided by Example 5. To improve film uniformity in terms of composition, among other desirable uniformity features such as thickness, one may rotate the substrate 207 around its vertical axis 505 within the slightly differently composed sputter plasma plumes 503 and 503A. A third sputter target may be added to the vacuum deposition reactor that either has the composition of the first or second target or it may have a different composition, such as the target provided in Example 6.

Figure 6:
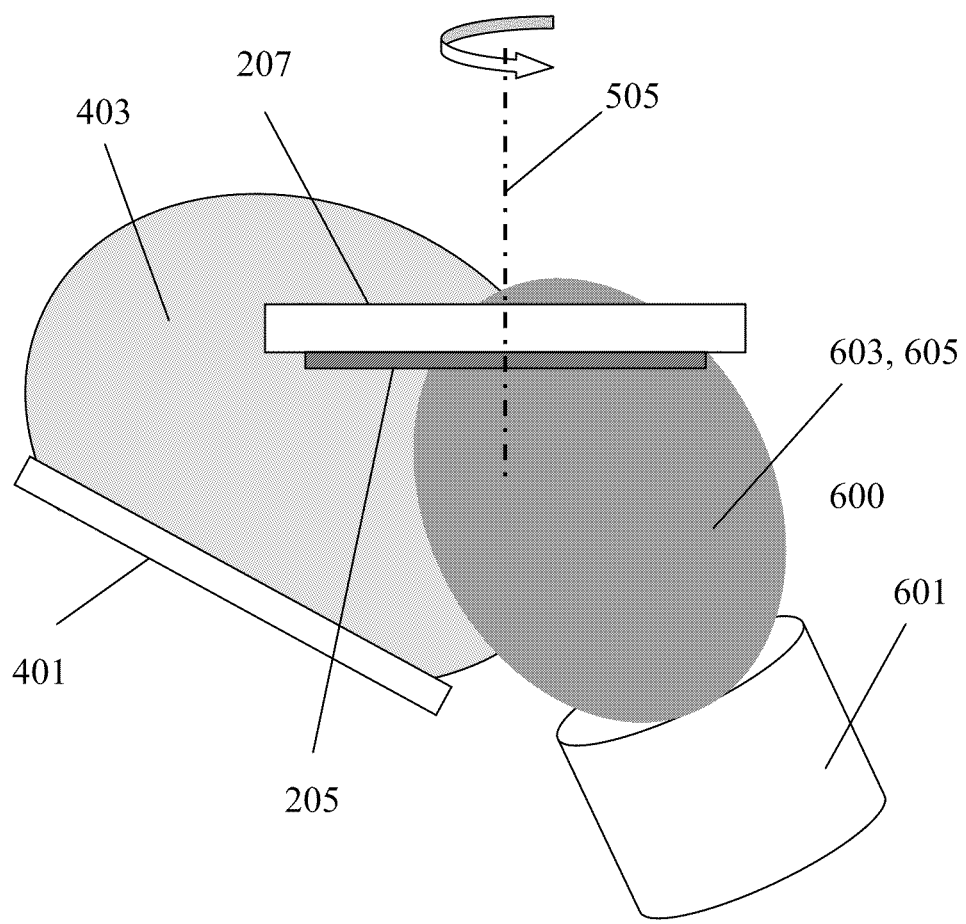
FIG. 6 illustrates an embodiment of the deposition of an electrolyte film onto a substrate which is created by directing both the plasma sputter plume of a sputter deposition and the evaporation plume of a resistive evaporation process onto the substrate.

Example 8 (FIG. 6) provides an exemplary embodiment of process 100 in which the deposition of the LIPON film 205 provided by Example 3 (FIG. 4) may be supported by a non-sputter deposition process 600, such as resistive evaporation of metallic lithium from a suitable crucible 601, such as Ta. The lithium vapor 603 that is directed towards the growing LIPON film 205 not only adjusts the lithium concentration in the film 205 but may also vary the concentrations of oxygen and nitrogen that are co-deposited into the film through the deposition of lithium in the nitrogen and oxygen containing atmosphere 403 and 605. To improve film uniformity in terms of composition, among other desirable uniformity features such as thickness, one may rotate the substrate 207 around its vertical axis 505.

Example 9 provides an exemplary embodiment of process 100 in which the deposition provided by Example 8 may comprise a shutter mechanism that may temporarily interrupt either the sputter deposition or the non-sputter deposition for seconds to minutes so as to create a layered stack of differently electrolytically active layers, which may or may not be diffused into each other by a thermal treatment of the LIPON film, either during deposition or after the deposition.

Figure 7:
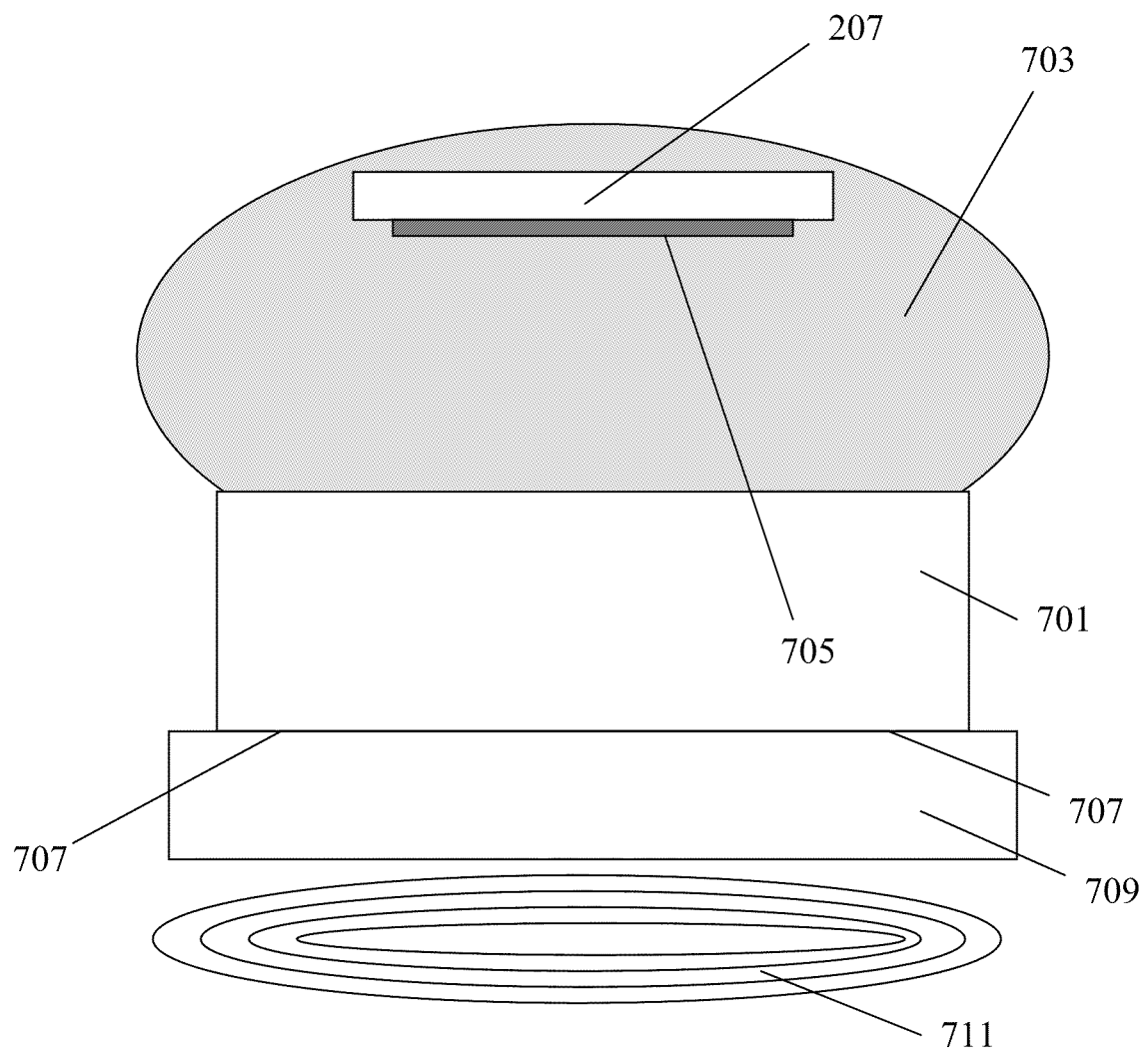
FIG. 7 illustrates an embodiment of the method of a thick metallic sputter target for the sputter deposition of an electrolyte film.

Example 10 (FIG. 7) provides an exemplary embodiment of process 100 in which a sputter target 701 is fabricated from a $Li_{50}Al_{50}$ alloy and DC, pulsed DC, AC, or RF sputtered deposited in a sputter plasma plume 703 consisting of the sputtered material and a reactive gas mixture of $F_2$—Ar resulting in the glassy lithium ion electrolyte $LiAlF_4$ 705. The $Li_{50}Al_{50}$ alloy is metallically conducting and can be made up to 5 cm thick by standard metallurgical methods inside inert atmosphere such as argon. Sputtering such thick target 701 is still possible because it has a high heat conductivity that allows the cooling 711 of the target backside 707 through the target backing plate 709 to remain feasible. Such a thick target requires less frequent replacement than a thinner target and thus reduces (i) the maintenance intervals of the vacuum deposition reactor and (ii) the operational costs.

The embodiments and examples described above are exemplary only. One skilled in the art may recognize variations from the embodiments specifically described here, which are intended to be within the scope of this disclosure and invention. As such, the invention is limited only by the following claims. Thus, it is intended that the present invention cover the modifications of this invention provided they come within the scope of the appended claims and their equivalents.

What is claimed is:

1. A method of fabricating a lithium-ion thin-film electrolyte, comprising
   providing an electronically conductive sputter target with an electronic conductivity of at least $10^{-8}$ S/cm at room temperature;
   providing a vacuum deposition chamber;
   sputtering said electronically conductive sputter target; and
   depositing a lithium-ion thin-film electrolyte in a reactive sputter gas atmosphere.

2. The method of claim 1, wherein said thin-film electrolyte comprises lithium phosphorus oxynitride.

3. The method of claim 1, wherein said lithium-ion thin-film electrolyte comprises at least one element selected from the group of: oxygen, nitrogen, fluorine, chlorine, bromine, iodine, sulfur, selenium, tellurium, phosphorus, arsenic, antimony, bismuth, lead, carbon, hydrogen, silicon, sodium, magnesium, and zirconium.

4. The method of claim 1, wherein said vacuum deposition chamber is not RF compatible.

5. The method of claim 1, wherein said reactive sputter gas atmosphere comprises at least one element selected from the group of: oxygen, nitrogen, fluorine, chlorine, bromine, iodine, sulfur, selenium, tellurium, phosphorus, arsenic, antimony, bismuth, lead, carbon, hydrogen, silicon, lithium, sodium, magnesium, and zirconium.

6. The method of claim 5, further comprising providing said reactive sputter gas atmosphere with said at least one element provided in the form of a gaseous chemical element under sputter deposition process conditions.

7. The method of claim 5, further comprising providing said reactive sputter gas atmosphere with said at least one element provided in the form of gaseous chemical compound under sputter deposition process conditions.

8. The method of claim 1, wherein said conductive sputter target comprises at least one element selected from the group of: oxygen, nitrogen, fluorine, chlorine, bromine, iodine, sulfur, selenium, tellurium, phosphorus, arsenic, antimony, bismuth, lead, carbon, hydrogen, silicon, lithium, sodium, magnesium, and zirconium.

9. The method of claim 1, wherein said conductive sputter target comprises at least one material selected from the group of: lithium phosphide and sub-phosphide ($Li_xP$ for $1 \leq x \leq 100$), lithium nitride and sub-nitride ($Li_xN$ for $3 \leq x \leq 100$), phosphorus oxide and sub-oxide ($PO_x$ for $x \leq 2.5$), phosphorus nitride and sub-nitride ($PN_x$ for $x \leq 1.7$), lithium oxide and sub-oxide ($Li_xO$ for $1 \leq x \leq 100$), and elemental phosphorus.

10. The method of claim 1, further comprising energizing said conductive sputter target with radio frequency (RF) power within the frequency range between 1 MHz and 1 GHz.

11. The method of claim 1, further comprising energizing said conductive sputter target with alternating current (AC) power within the frequency range between 1 Hz and 1 MHz.

12. The method of claim 1, further comprising energizing said conductive sputter target with direct current (DC) power.

13. The method of claim 1, further comprising energizing said conductive sputter target with pulsed direct current (pulsed DC) power.

14. The method of claim 1, further comprising energizing said conductive sputter target with a mixed power consisting of a combination of RF, AC, pulsed DC, and DC.

15. The method of claim 1, wherein said conductive sputter target exhibits an electronic conductivity of more than $10^{-4}$ S/cm at room temperature.

16. The method of claim 1, wherein said conductive sputter target exhibits an electronic conductivity of more than 1 S/cm at room temperature.

17. The method of claim 1, further comprising converting said conductive sputter target material into thin-film electrolyte material at the substrate surface.

18. The method of claim 1, further comprising using more than one conductive sputter target to deposit said thin-film electrolyte.

19. The method of claim 1, further comprising providing one or more non-sputter deposition layers onto a growing film area.

20. The method of claim 1, further comprising providing one or more non-sputter deposition layers onto a growing film area in an alternating periodic fashion.

21. The method of claim 19, further comprising providing said non-sputter deposition from a material source that is either electrically conducting or insulating.

22. The method of claim 1, wherein said conductive sputter target comprising a thickness between 0.6 cm and 5 cm.

23. The method of claim 1, wherein said conductive sputter target comprises target tile segments.

24. The method of claim 23, wherein said target tile segments comprises at least one element selected from the group of: a single-phase material, a multi-phase material, a material composite.

25. The method of claim 23, wherein at least one of said target tile segments is larger than 300 $cm^2$.

* * * * *